US006768818B2

(12) United States Patent
Friederich et al.

(10) Patent No.: US 6,768,818 B2
(45) Date of Patent: Jul. 27, 2004

(54) METHOD AND SYSTEM FOR COMPRESSING DATA AND A GEOGRAPHIC DATABASE FORMED THEREWITH AND METHODS FOR USE THEREOF IN A NAVIGATION APPLICATION PROGRAM

(75) Inventors: Matthew Friederich, Berwyn, IL (US); James A. Meek, Palatine, IL (US)

(73) Assignee: Navteq North America, LLC, Chicago, IL (US)

( * ) Notice: Subject to any disclaimer, the term of this patent is extended or adjusted under 35 U.S.C. 154(b) by 0 days.

(21) Appl. No.: 10/464,717

(22) Filed: Jun. 17, 2003

(65) Prior Publication Data

US 2003/0210825 A1 Nov. 13, 2003

Related U.S. Application Data

(62) Division of application No. 10/104,947, filed on Mar. 22, 2002, now Pat. No. 6,600,841, and a division of application No. 09/153,996, filed on Sep. 17, 1998, now Pat. No. 6,393,149.

(51) Int. Cl.[7] .......................... G06K 9/36; G01C 21/26; H03M 5/00; G06F 7/00
(52) U.S. Cl. ...................... 382/233; 382/305; 701/200; 341/55; 707/102
(58) Field of Search ................................ 382/232, 233, 382/245, 246, 305, 173; 341/55, 67; 701/200–210; 707/1–4, 100, 101, 102

(56) References Cited

U.S. PATENT DOCUMENTS

| 4,730,348 A | 3/1988 | MacCrisken |
| 4,827,419 A | 5/1989 | Selby, III |
| 4,888,698 A | 12/1989 | Driessen et al. |

(List continued on next page.)

FOREIGN PATENT DOCUMENTS

| EP | 0 838 663 A2 | 4/1998 |
| EP | 0 838 771 | 4/1998 |

OTHER PUBLICATIONS

Matsuyama, Takashi et al., "A File Organization for Geographic Information Systems based on Spatial Proximity" Computer Vision, Graphics, and Image Processing 26:303–318 (1984).

(List continued on next page.)

Primary Examiner—Kanji Patel
(74) Attorney, Agent, or Firm—Frank J. Kozak; Jon D. Shutter; Lawrence M. Kaplan

(57) ABSTRACT

A data compression method and system that include the substitution of a substring of data characters located at a first position in a stream of data characters with a substitution code. The substitution code includes a reference to a previous position in the stream of data characters at which is located a substring of data characters that matches the substring of data characters which are being substituted located at the first position. The substitution code also includes an indication of the size of the substituted substring. The reference in the substitution code is a backwards offset to the previous position relative to the first position. According to a further aspect, Huffman encoding can be applied to the backward offsets, the substring lengths, the consecutive literal character lengths, and the literal characters themselves to reduce the data requirement size. In an application of the data compression method to geographic data that has been organized to facilitate access and use by a navigation application program, the Huffman tree(s) for decoding the encoded characters are stored in a separate portion of the database from portions that include the data that have been compressed using the Huffman coding, thereby facilitating the use of the same Huffman tree(s) for more than one portion of the data records.

16 Claims, 11 Drawing Sheets

U.S. PATENT DOCUMENTS

| | | |
|---|---|---|
| 5,140,532 A | 8/1992 | Beckwith, Jr. et al. |
| 5,146,221 A | 9/1992 | Whiting et al. |
| 5,506,580 A | 4/1996 | Whiting et al. |
| 5,525,982 A | 6/1996 | Cheng et al. |
| 5,532,694 A | 7/1996 | Mayers et al. |
| 5,543,789 A | 8/1996 | Behr et al. |
| 5,572,206 A | 11/1996 | Miller et al. |
| 5,808,566 A | 9/1998 | Behr et al. |
| 5,845,226 A | 12/1998 | Ajima |
| 5,902,347 A | 5/1999 | Backman et al. |
| 5,951,623 A | 9/1999 | Reynar et al. |
| 5,968,109 A * | 10/1999 | Israni et al. ............... 701/208 |
| 5,995,970 A | 11/1999 | Robinson et al. |
| 6,047,280 A * | 4/2000 | Ashby et al. ................. 707/2 |
| 6,073,076 A * | 6/2000 | Crowley et al. ............ 701/208 |
| 6,081,803 A * | 6/2000 | Ashby et al. .................. 707/4 |
| 6,108,533 A | 8/2000 | Brohoff |

OTHER PUBLICATIONS

Web pages, The GZIP home and Introduction pages (http://www.gzip.org), pp. 1–6, (before 1998).

Web pages, GZIP, The data compression program (http://min.ethz.ch/computers/sepp/gzip–1.2.4–to/gzip.html), pp. 1–9, (before 1998).

Web pages, GNU zip, Universiteit Gent (http:///allserv.ru-g.ac.be/unix/software/gzip.html), p. 1 of 1, (before 1998).

* cited by examiner

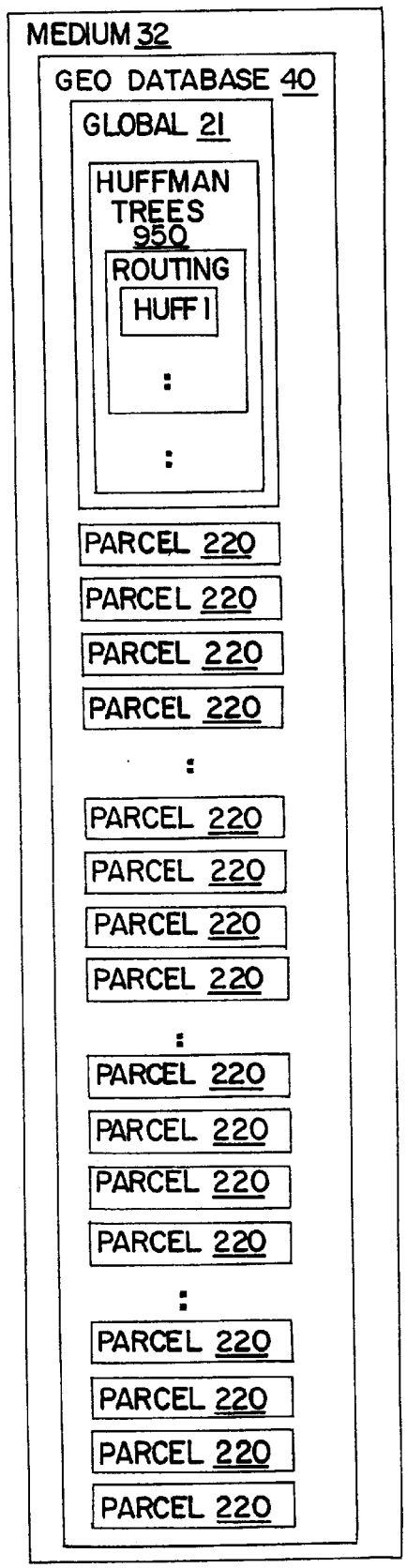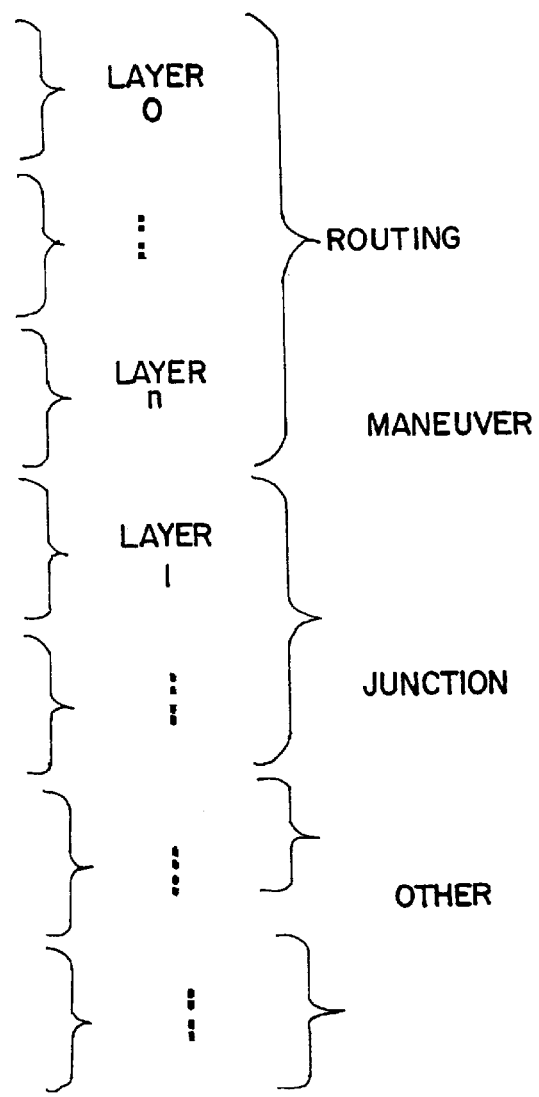
FIG. 6

FIG. 8
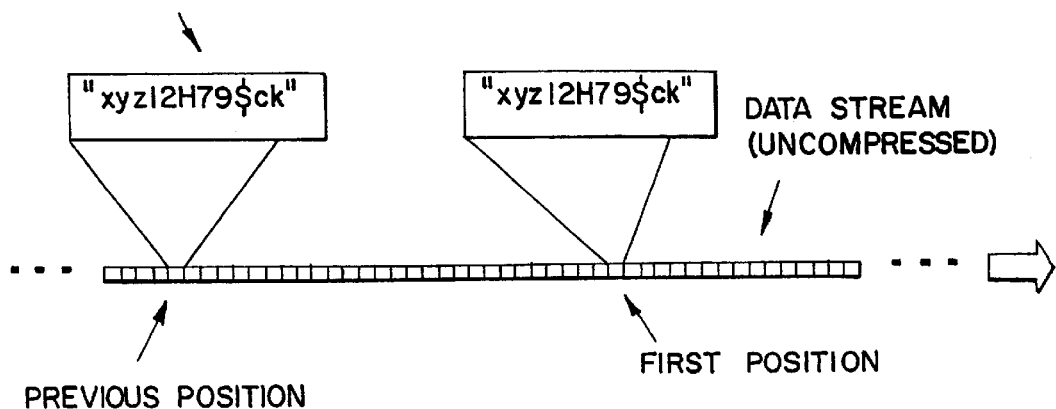
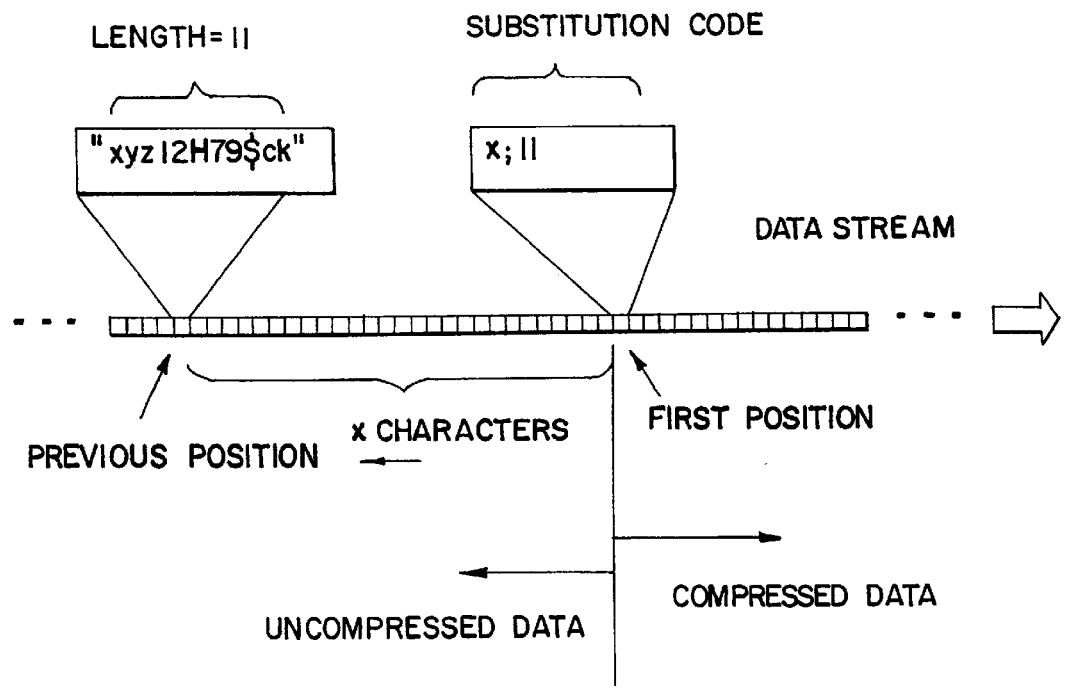

FIG. 10

DATA STREAM

"...xztjxihgppcbscbagppcbacbs..."

| BYTE | UNCOMPRESSED VALUE | WITH SUBSTITUTION AND RUN LENGTH COUNT CODES | COMPRESSED CODED DATA STREAM |
|---|---|---|---|
| 1 | x | lit, 13 | huff3 ( lit, 13) |
| 2 | z | x | huff1 ( x ) |
| 3 | t | z | huff1 ( z ) |
| 4 | j | t | huff1 ( t ) |
| 5 | x | j | huff1 ( j ) |
| 6 | i | x | huff1 ( x ) |
| 7 | h | f | huff1 ( i ) |
| 8 | g | h | huff1 ( h ) |
| 9 | p | g | huff1 ( g ) |
| 10 | p | p | huff1 ( p ) |
| 11 | c | p | huff1 ( p ) |
| 12 | b | c | huff1 ( c ) |
| 13 | s | b | huff1 ( b ) |
| 14 | c | s | huff1 ( s ) |
| 15 | b | lz, -3 | huff3( lz, -3 ) |
| 16 | a | 2 | huff2 ( 2 ) |
| 17 | g | lit, 1 | huff3( lit, 1 ) |
| 18 | p | a | huff1 ( a ) |
| 19 | p | lz, -9 | huff3 ( lz, -9 ) |
| 20 | c | 5 | huff2 ( 5 ) |
| 21 | b | lit, 1 | huff 3( lit) |
| 22 | a | a | huff1( a ) |
| 23 | c | lz, -12 | huff3( lz, -12 ) |
| 24 | b | 3 | huff2( 3 ) |
| 25 | s | : | : |
| 26 | : | : | : |
| 27 | : | : | : |

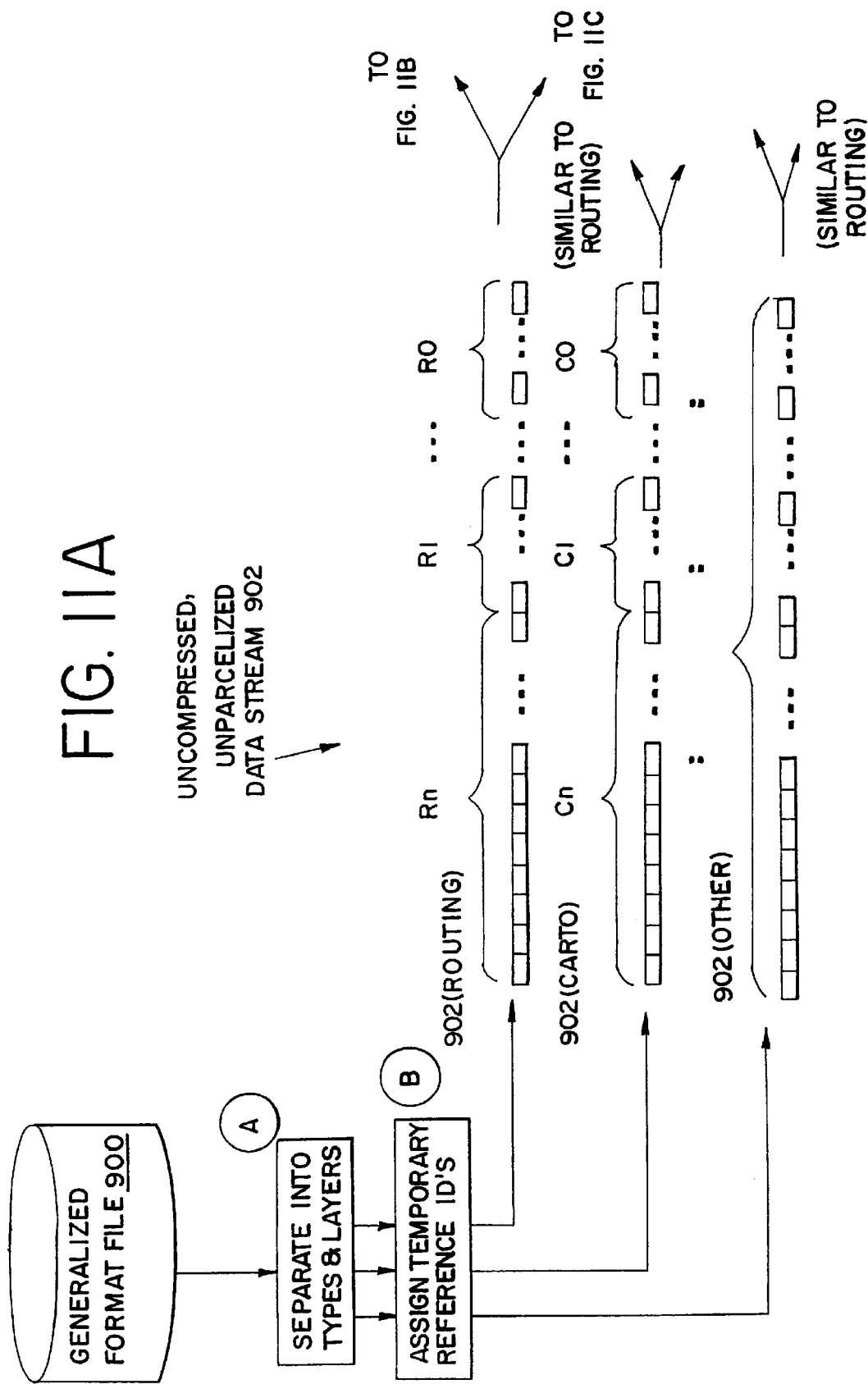

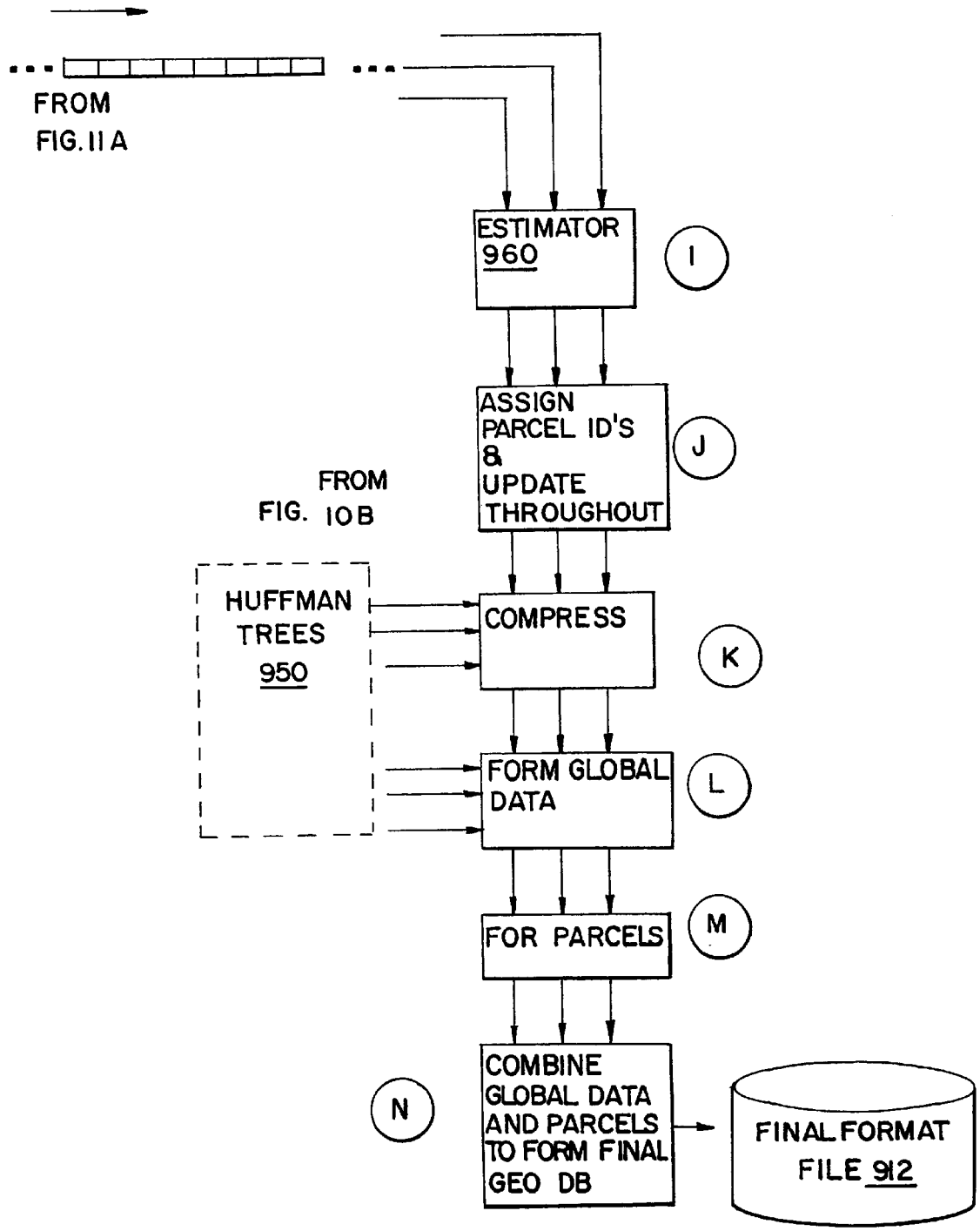

METHOD AND SYSTEM FOR COMPRESSING DATA AND A GEOGRAPHIC DATABASE FORMED THEREWITH AND METHODS FOR USE THEREOF IN A NAVIGATION APPLICATION PROGRAM

REFERENCE TO RELATED APPLICATION

The present application is a divisional of Ser. No. 09/153,996, filed Sep. 17, 1998, now U.S. Pat. No. 6,393,149 and Ser. No. 10/104,947 filed Mar. 22, 2002 now U.S. Pat. No. 6,600,841, the entire disclosures of which are incorporated herein by reference.

BACKGROUND OF THE INVENTION

The present invention relates to a compression system and method, and more particularly, the present invention relates to a compression method that can be used with geographic data used by a navigation application program that provides navigating features and functions to an end-user.

Computer-based navigation application programs are available that provide end-users (such as drivers of vehicles in which the navigation systems are installed) with various navigating functions and features. For example, some navigation application programs are able to determine an optimum route to travel by roads between locations in a geographic region. Using input from an end-user, and optionally from equipment that can determine one's physical location (such as a GPS system), a navigation application program can examine various routes between two locations to determine an optimum route to travel from a starting location to a destination location in a geographic region. The navigation application program may then provide the end-user with information about the optimum route in the form of instructions that identify the maneuvers required to be taken by the end-user to travel from the starting location to the destination location. If the navigation system is located in an automobile, the instructions may take the form of audio instructions that are provided along the way as the end-user is traveling the route. Some navigation application programs are able to show detailed maps on computer displays outlining routes to destinations, the types of maneuvers to be taken at various locations along the routes, locations of certain types of features, and so on.

In order to provide these and other navigating functions, the navigation application program uses one or more detailed databases that include data which represent physical features in a geographic region. The detailed database may include data representing the roads and intersections in a geographic region and also may include information relating to the represented roads and intersections in a geographic region, such as turn restrictions at intersections, speed limits along the roads, street names of the various roads, address ranges along the various roads, and so on.

One difficulty in providing geographic data for use by a navigation application program relates to the efficient utilization of the available computer resources of the navigation system on which the navigation application program is run. Computer-based navigation application programs are provided on various platforms including some with relatively limited computer resources. For example, navigation systems may be located in vehicles or may be hand-held. These types of navigation systems may have relatively limited computer resources, such as limited memory and relatively slow I/O. In order to provide a high level of functionality in such systems, it is required that the available computer resources be used efficiently.

The limited resources of some navigation systems can affect the ability of these types of navigation systems to provide desired navigation functions, especially when using a relatively large geographic database that includes a relatively high level of detail. Handling the large amounts of data included in a geographic database may adversely affect the performance of navigation systems with limited resources.

Another consideration related to the use of geographic data by navigation systems is that given the relatively large size of the geographic database necessary to provide a desired level of functionality to the end-user, all the data records for an entire geographic region cannot be loaded into the memory of the navigation system at the same time. This is especially true for navigation system platforms with limited resources, such as systems installed in vehicles or hand-held systems. Due to the limited memory resources of these navigation systems, it is necessary to load geographic data as needed from a storage medium, such as a CD-ROM disk, into the memory of the navigation system for use by the navigation application program. Unfortunately, in these types of systems, I/O access from a storage medium may be relatively slow. Thus, the relatively limited memory resources of some types of navigation systems, combined with relatively slow I/O, can limit performance thereby resulting in slow response. Aside from being undesirable, slow response in a navigation system may render the system useless for its intended purpose in certain circumstances. For example, if the navigation system is installed in a vehicle, the driver may require information from the navigation system about a desired route in a matter of seconds in order to utilize the information while driving. If the navigation system requires more than several seconds to calculate a route, the driver may have moved beyond the point at which the routing information provided by the navigation system is relevant. Therefore, it is important that navigation systems operate efficiently in order to provide navigating information relatively quickly.

Navigation application programs may also be run on computer platforms that have in general greater memory resources and faster I/O, such as personal computers or networks. Although these systems may have more and faster resources, the considerations related to the efficient use of geographic data still apply, but on a larger scale. With these types of systems, even greater functionality can be provided if the limitations imposed by memory size and I/O are minimized.

To improve the performance of navigation systems generally and in particular to compensate for the limitations of some navigation system platforms with limited hardware resources, techniques have been devised or implemented to improve navigation system performance by organizing, structuring, or arranging the geographic database or the data in the geographic database in particular ways. Because a navigation system uses geographic data in certain known and expected ways to perform known functions, the geographic data can be organized, structured, or arranged in ways that facilitate their use in these known ways by the navigation system.

One of the techniques that can be used to facilitate the use of geographic data by navigation systems is to organize at least some of the geographic data spatially. When geographic data are organized spatially, geographic features that are close together physically in the geographic region are represented by data records that are, in general, close together in the database and/or on the medium. This kind of organization may minimize the amount of searching in the geographic database when performing some navigation functions.

Another technique that can be used to facilitate access by an application in a navigation system is to organize at least some of the geographic database into groupings (or parcels). When geographic data are organized into parcels, the plurality of data records that together comprise the geographic database are separated into separate groupings (or parcels). The selection of data records to be included in each parcel is based upon a likelihood that all the data records needed to perform a particular navigation function are included in relatively few parcels. For example, parcels may be used to organize some or all of the geographic data spatially. Using parcelization to organize geographic data spatially, geographic features that are located close together physically in the geographic region are represented by data records that are included in the same parcel. Various criteria may be used as a basis for organizing geographic data into parcels, including non-spatial factors such as by administrative area, alphabetical by name, and so on.

Another technique that can be implemented in a geographic database to enhance operation of the navigation system is to minimize consideration of minor or secondary roads during calculation of a route. One way to suppress consideration of minor or secondary roads is to organize some or all of the geographic data into layers using rankings assigned to roads in a geographic region. The rankings can be related to a functional classification of the roads. Major roads upon which travel is generally faster are assigned higher rankings and minor roads upon which travel is generally slower are assigned lower rankings. Using these rankings, data records that represent higher ranked roads can be stored in separate layers in the geographic database. The navigation application program uses the higher layers when possible. Since the higher layers omit slower secondary roads, these generally slower roads are not considered when the higher layers are used to calculate the route, thereby minimizing the possible road segments that need to be investigated. This kind of database arrangement may facilitate the route calculation navigation function, thereby providing improved navigation system performance.

In addition to spatial organization, parcelization, and layering, there are other techniques that can be implemented in a geographic database that can enhance the performance of a navigation application in the navigation system that uses the geographic database. Some or all of the above techniques can be used together in a geographic database to enhance operation of a navigation application that uses the geographic database.

One factor that affects the way that the geographic database is used by a navigation system relates to the size of the coverage area of the geographic database. The coverage area of a geographic database refers to the size of the geographic region represented by the data in the geographic database. A coverage area may include an entire metropolitan area, such as New York and its suburbs, Chicago and its suburbs, or Los Angeles and its suburbs. A coverage area may also include an entire country, such as Germany. In general, it is preferable to make the coverage area as large as possible.

Factors that may affect the size of the coverage area of a geographic database include the type of media upon which the geographic database is stored and the level of detail of the geographic database. In order to provide the navigation features desired by navigation system end-users, a geographic database includes a relatively large amount of data with a correspondingly high level of detail. Various kinds of media can be used for storing a geographic database in a navigation system. These different kinds of media include, for example, CD-ROM disks, PCMCIA cards, hard disks, DVD disks, and so on. Each of these different kinds of media has advantages and disadvantages. Regardless of the kind of media used, it would be desired to store as much data on the media as possible, thereby providing as large a coverage area as possible, or as much detail as possible, or a maximum combination of coverage area and detail. Thus, the geographic data should be stored efficiently on the medium.

There are conventional data compression techniques that increase the amount of data that can be stored on a medium. Some conventional data compression techniques have the disadvantage of requiring substantial additional processing to decompress the data from a compressed form in which they are stored on the medium. This additional processing may adversely affect performance of some navigation systems. In addition, some conventional data compression techniques involve rearranging portions of the data or substituting portions of the original collection of data with other data. Such data compression techniques may be incompatible with the techniques, described above, that enhance certain navigation functions. If such conventional data compression techniques are not entirely incompatible with the navigation enhancing techniques, described above, they may nonetheless offset the advantages associated with the navigation enhancing techniques.

Accordingly, it is one objective to provide a means to store geographic data efficiently on a medium. It is another objective to provide one or more data compression techniques in a geographic database that is organized in a manner that facilitates its use by a navigation application program. It is another objective to provide a data compression technique that can be used for various kinds of data, and geographic data in particular.

SUMMARY OF THE INVENTION

To address the above concerns, according to one aspect of the present invention, a data compression system and method are provided. The data compression system and method can be used to compress various kinds of data, and in particular, can be used to compress geographic data stored on a physical data storage medium. The data compression method comprises searching in a preceding portion of an input stream of data characters from a first position for a sequence of a plurality of data characters that matches a sequence of a plurality of data characters at the first position. Upon finding a matching sequence of a plurality of data characters, the sequence of a plurality of data characters for which a matching sequence of a plurality of data characters was found in the preceding portion of the input stream is replaced with a reference to the matching sequence of a plurality of data characters in the preceding portion of the input stream. The reference comprises a backwards offset from the first position to the position in the preceding portion of the input stream at which the matching sequence of a plurality of data characters is located and a size of the matching sequence.

According to further aspects, the backward offsets, the data that indicate the sizes of the matching sequences, the data that indicate the lengths of non-substitution code characters, and the literal characters themselves can be Huffman encoded. In an application of the data compression method to geographic data that has been organized to facilitate access and use by a navigation application program, the one or more Huffman trees for decoding the Huffman codes are stored in a separate portion of the database from portions that include the data records that have been compressed using the Huffman encoding.

According to a further aspect of the disclosed subject matter, a decompression method and program are provided. The decompression method reverses the compression process. Starting from one end of a compressed data stream and advancing through the compressed data stream to the other end, as substitution codes are encountered, the substitution codes are replaced with substrings which are located in previous portions of the data stream. Each substitution code includes a backwards offset and an indication of the substitution substring length. When each substitution code is encountered during the step of advancing through the compressed data stream during decompression, a substring of the indicated substitution substring length and located at the position in the previous portion of the data stream indicated by the backwards offset is inserted to the portion of the data stream.

BRIEF DESCRIPTION OF THE DRAWINGS

FIG. 6 is a diagram showing the arrangement of parcels of data in the geographic database of FIG. 1.

FIG. 8 is a diagram illustrating replacement of a substring in a first position in an original data stream with a substitution code that references a previously occurring matching substring in a compressed data stream.

FIG. 10 is a diagram including a table showing use of Huffman encoding of a data string, offsets, and data string lengths, according to an example illustrating use of an embodiment of the disclosed compression system.

FIGS. 11A–11C are illustrations of a process for forming a geographic database that is compressed using an embodiment of the disclosed compression method.

DETAILED DESCRIPTION OF THE PRESENTLY PREFERRED EMBODIMENTS

I. Navigation System—Overview

Figure 1:
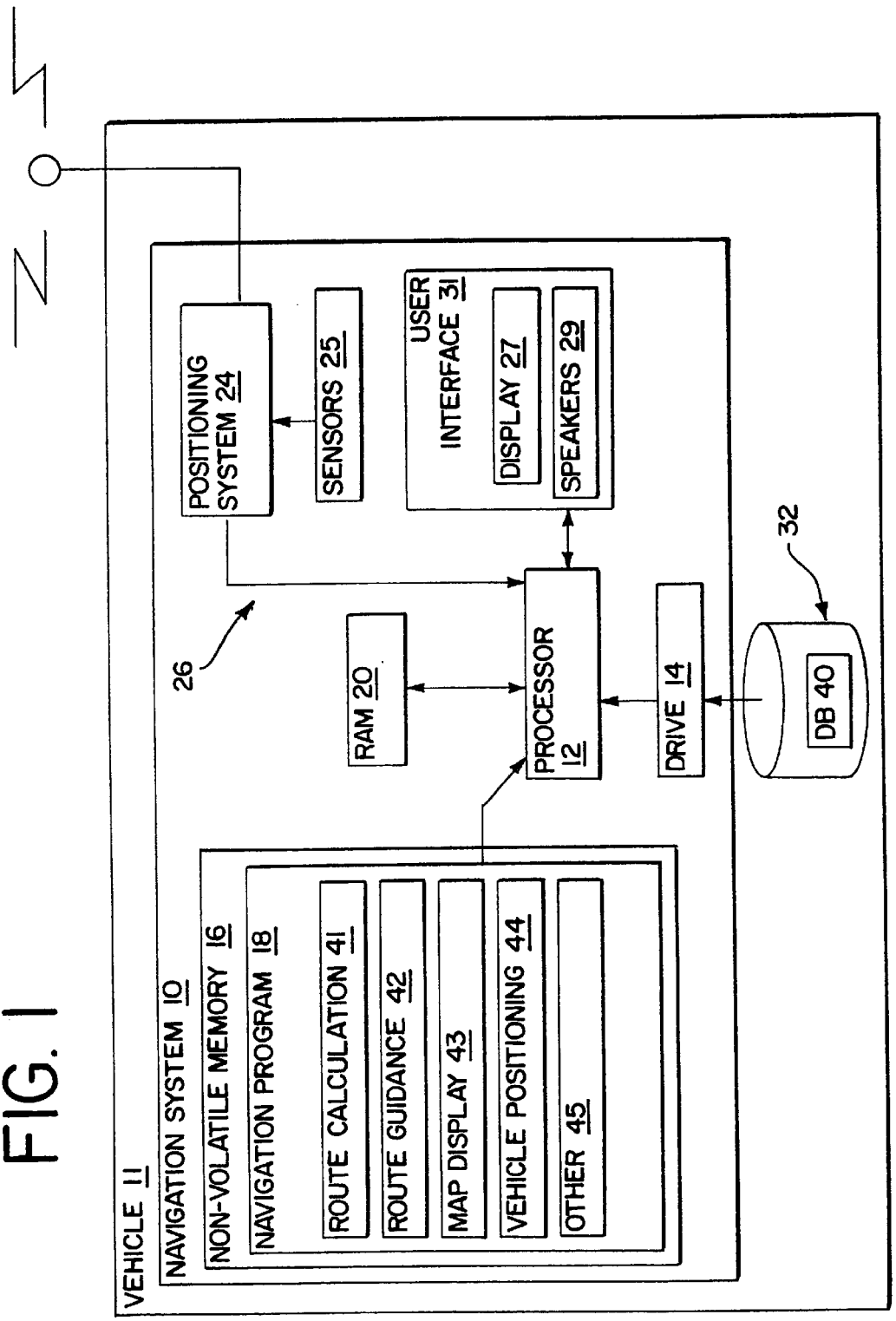
FIG. 1 is a block diagram illustrating a navigation system.

Referring to FIG. 1, there is a block diagram of a navigation system 10. The navigation system 10 is installed in a vehicle 11, such as a car or truck, although in alternative embodiments, the navigation system 10 may be located outside of a vehicle or may be implemented in various other platforms or environments, as described below.

Referring to the embodiment illustrated in FIG. 1, the navigation system 10 is a combination of hardware and software components. In one embodiment, the navigation system 10 includes a processor 12, a drive 14 connected to the processor 12, and a non-volatile memory storage device 16 for storing a navigation application software program 18 and possibly other information. The processor 12 may be of any type used in navigation systems, such as 32-bit processors using a flat address space, such as a Hitachi SH1, an Intel 80386, an Intel 960, a Motorola 68020 (or other processors having similar or greater addressing space). Processor types other than these, as well as processors that may be developed in the future, may also be suitable.

The navigation system 10 may also include a positioning system 24. The positioning system 24 may utilize GPS-type technology, a dead reckoning-type system, or combinations of these, or other systems, all of which are known in the art. The positioning system 24 may include suitable sensing devices 25 that measure the traveling distance, speed, direction, and so on, of the vehicle. The positioning system 24 may also include appropriate technology to obtain a GPS signal, in a manner which is known in the art. The positioning system 24 outputs a signal 26 to the processor 12. The signal 26 may be used by the navigation application software 18 that is run on the processor 12 to determine the location, direction, speed, etc., of the navigation system 10.

The navigation system 10 also includes a user interface 31. The user interface 31 includes appropriate equipment that allows the end-user to input information into the navigation system. This input information may include a request to use the navigation features of the navigation system. For example, the input information may include a request for a route to a desired destination. The input information may also include other kinds of information. The equipment used to input information into the navigation system may include a keypad, a keyboard, a microphone, etc., as well as appropriate software, such as a voice recognition program. The user interface 31 also includes suitable equipment that provides information back to the end-user. This equipment may include a display 27, speakers 29, or other means.

The navigation system 10 uses a map database 40 stored on a storage medium 32. The storage medium 32 is installed in the drive 14 so that the map database 40 can be read and used by the navigation system. The storage medium 32 may be removable and replaceable so that a storage medium with an appropriate map database for the geographic region in which the vehicle is traveling can be used. In addition, the storage medium 32 may be replaceable so that the map database 40 on it can be updated easily. In one embodiment, the geographic data may be published by Navigation Technologies of Sunnyvale, Calif.

In one embodiment, the storage medium 32 is a CD-ROM disk. In an alternative embodiment, the storage medium 32 may be a PCMCIA card in which case the drive 14 would be replaced with a PCMCIA slot. Various other storage media may be used, including fixed or hard disks, DVD (digital video disks) or other currently available storage media, as well as storage media that may be developed in the future. The storage medium 32 and the geographic database 40 do not have to be physically provided at the location of the navigation system. In alternative embodiments, the storage medium 32, upon which some or all of the geographic data 40 are stored, may be located remotely from the rest of the navigation system and portions of the geographic data provided via a communications link, as needed.

The navigation application software program 18 is loaded from the non-volatile memory 16 into a RAM 20 associated with the processor 12 in order to operate the navigation system. The navigation system 10 uses the map database 40 stored on the storage medium 32, possibly in conjunction with the output 26 from the positioning system 24, to provide various navigation features and functions. The navigation application software program 18 may include separate applications (or subprograms) that provide these various navigation features and functions. These functions and features may include route calculation 41, route guidance 42

(wherein detailed directions are provided for reaching a desired destination), map display 43, vehicle positioning 44 (e.g., map matching), and other functions 45.

II. The Geographic Map Database

A. Overview.

In one embodiment, the speed and/or functionality of a navigation system can be enhanced by a combination that includes improvements in the storage, arrangement, and/or structuring of the geographic data used by the system to facilitate the use of the data by some of the functions in the navigation application program in the systems that use the data. Based upon the manner in which the geographic data are stored, arranged, and/or structured, functions in the navigation application program that access and use the data can implement routines that exploit the improvements incorporated into the geographic data. This combination can result in overall improved performance by the navigation system.

The map database 40 contains information about the roadway network in the geographic region. In one embodiment, the map database 40 includes node data and segment data. These data represent components of the physical road network. Node data represent physical locations in the geographic region (such as roadway intersections and other positions) and segment data represent portions of roadways between the physical locations represented by nodes. Each road segment in the geographic region is represented by a road segment data entity (i.e., a record) in the map database 40. Each road segment data record in the map database is associated with two nodes which represent the coordinate positions at each end of the road segment represented by the road segment data record. The information included in the node and segment data entities is explained with reference to FIGS. 2 and 3. (The terms "nodes" and "segments" represent only one terminology for describing these physical geographic features and other terminology for describing these features is intended to be encompassed within the scope of these concepts.)

Figure 2:
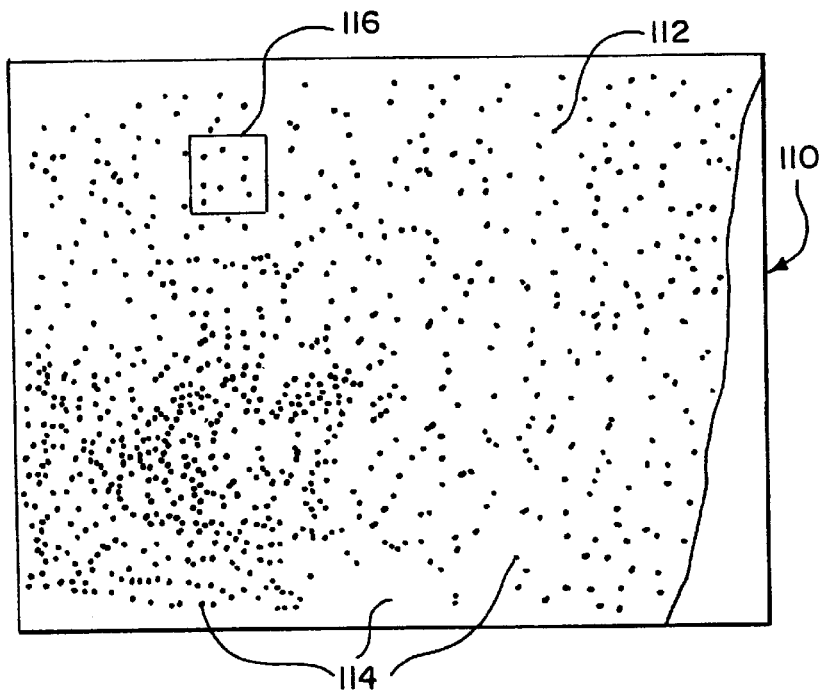
FIG. 2 illustrates a map showing a geographic region represented by the geographic database of FIG. 1.

FIG. 2 illustrates a map 110 showing a geographic region 112. A plurality of locations 114 are shown to be located in the geographic region 112. Each of the locations 114 represents a place or point in the geographic area 112 at which there is located a feature about which it is desired to include information in a geographic database. Each of these locations 114 has a unique physical location (latitude, longitude, and optionally absolute or relative altitude) and each of the locations 114 can be uniquely identified by its two dimensional (or three dimensional) geographic coordinates, (i.e., latitude, longitude, and optionally altitude). A location 114 may correspond to an intersection at which two or more roads meet, a point along a road segment at which the direction of the road changes, a point along a road segment at which the speed limit changes, a point at which a road reaches a dead end, and so on. The location 114 may correspond to a position of a point-of-interest, such as a hotel or civic center, a boundary of a natural feature, such as a lake, or a position along a railroad track or ferry. The locations 114 may correspond to anything physically located in the geographic area 112.

Figure 3:
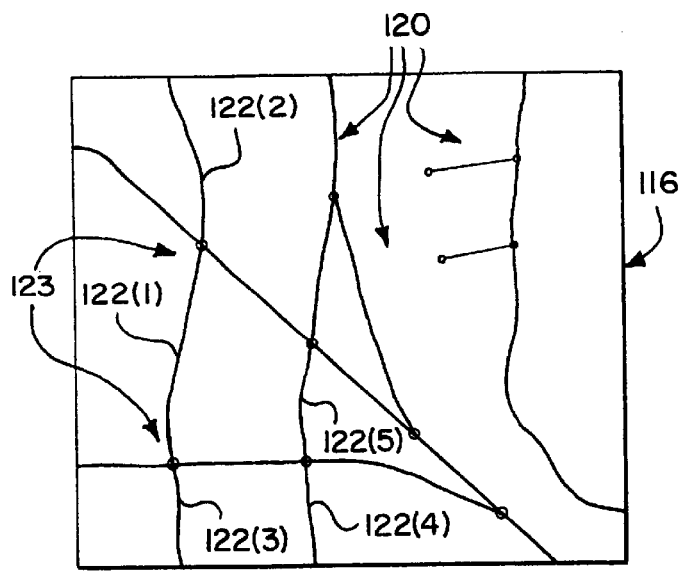
FIG. 3 shows an expanded view of a portion of the map of FIG. 2.

FIG. 3 shows an expanded view of a portion 116 of the map 110. The portion 116 in FIG. 3 illustrates part of the road network 120 in the geographic region 112. The road network 120 includes, among other things, roads and intersections located in the geographic region 112. As shown in FIG. 3 in the illustrated portion 116 of the map 110, each road in the geographic region 112 is composed of one or more segments, 122(1), 122(2) . . . 122(n). In one embodiment, a road segment represents a portion of the road. In FIG. 3, each road segment 122 is shown to have associated with it two nodes 123: one node represents the point at one end of the road segment and the other node represents the point at the other end of the road segment. The node at either end of a road segment may correspond to a location at which the road meets another road, e.g., an intersection, or where the road dead ends.

In one type of geographic database, there is at least one database entry (also referred to as "entity" or "record") for each road segment represented in a geographic region. This road segment data record may have associated with it information (such as "attributes", "fields", etc.) that allows identification of the nodes associated with the road segment and/or the geographic positions (e.g., the latitude and longitude coordinates) of the two nodes. In addition, the road segment record may have associated with it information (e.g., more "attributes", "fields", etc.), that specify the speed of travel on the portion of the roadway represented by the road segment record, the direction of travel permitted on the road portion represented by the road segment record, what turn restrictions exist at each of the nodes which correspond to intersections at the ends of the road portion represented by the road segment record, the street address ranges of the roadway portion represented by the road segment record, the name of the road, and so on. The various attributes associated with a road segment may be included in a single road segment record, or preferably are included in more than one type of road segment record which are cross-referenced to each other.

In a geographic database that represents the region 112, there may also be a database entry (entity or record) for each node in the geographic region. The node data record may have associated with it information (such as "attributes", "fields", etc.) that allows identification of the road segment(s) that connect to it and/or its geographic position (e.g., its latitude and longitude coordinates).

B. Separate Subsets of Geographic Data

One way that the accessing of geographic data can be enhanced for performing various navigation functions is to provide separate collections or subsets of the geographic data for use by each of the separate functions (e.g., 41–45) in the navigation application program 18. Each of these separate subsets is tailored specifically for use by a particular one or more of the functions. For instance, the route calculation function 41 (in FIG. 1) normally uses only a portion of all the information in the geographic database that is associated with a segment of a road. When the route calculation function 41 is being run, it may require information such as the speed along a road segment, turn restrictions from one road segment to another, and so on. However, the route calculation function 41 does not necessarily require the name of the road to calculate a route. Similarly, when using the map display function 43, some of the information associated with a road segment, such as the speed limits or turn restrictions, is not required. Instead, when the map display function 43 is run, it uses only a portion of the information associated with the road segment, such as the shapes and locations of roads, and possibly the names of the roads. Even further, when the route guidance function 42 is being run, some of the information associated with a segment of a road, such as the speed and turn restrictions, is not required. Instead, when the route guidance function 42 is being run, it uses information that includes the name of the road represented by the road segment, the address range along the road segment, any signs along the road segment, and so on. Although there may be some overlap as to the types of information used by the various navigation functions, some of the data used by any one of these navigation functions is not used by another of the functions. If all the information relating to each road segment were associated with it as a single data entry in a single database, each data entity record would be relatively large. Thus, whenever any one of the navigation functions accessed an entity record, it would have to read into memory a significant amount of information much of which would not be needed by the navigation function. Moreover, when reading the data entity from disk, relatively few data entities could be read at a time since each data entity would be relatively large.

In order to provide the information in the geographic database in a format more efficient for use by each of the navigation functions, separate subsets of the entire geographic database for a given geographic region are provided for each of the different types of navigation functions to be provided in the navigation application program 18.

Figure 4:
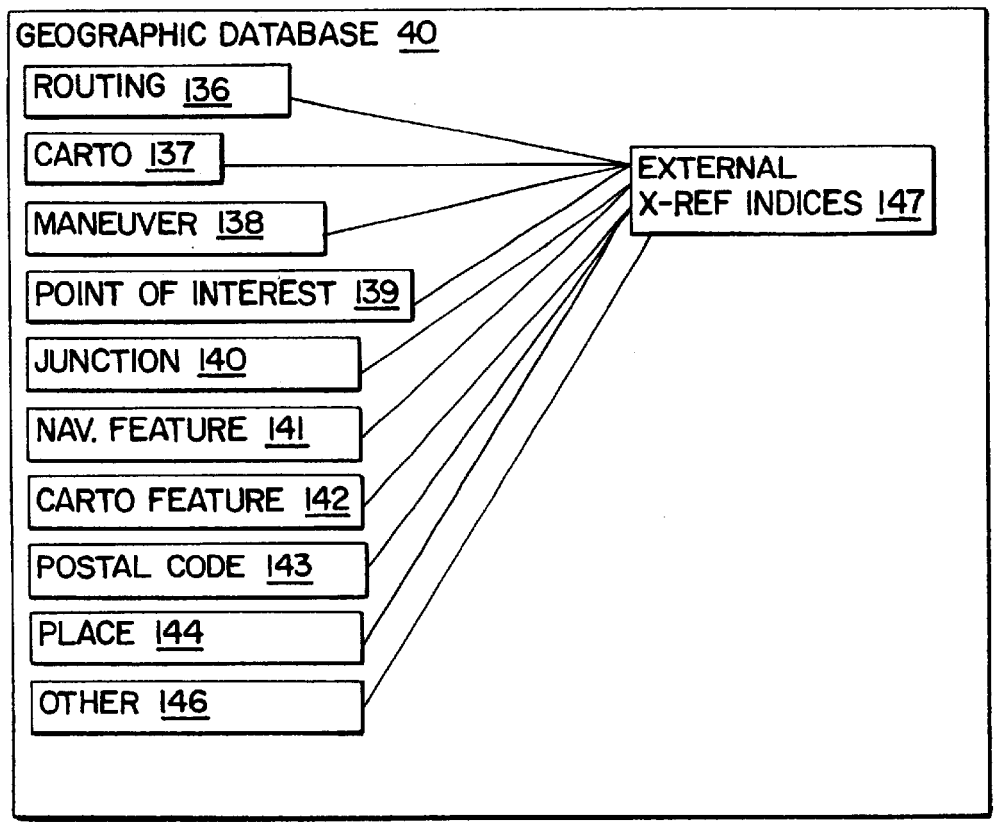
FIG. 4 is a diagram illustrating the different types of data included in the geographic database of FIG. 1 for use with various navigation application functions.

FIG. 4 illustrates the geographic database 40 comprised of separate routing data 136, cartographic data 137 (for map display), maneuver data 138 (for route guidance), point-of-interest data 139 (for identifying specific points of interest, such as hotels, restaurants, museums, stadiums, airports, etc.), and junction data 140 (for identifying named intersections). In addition to these types of data, the geographic database 40 may include navigation feature data 141 and cartographic feature data 142. These subsets of data include, respectively, the names of the navigable features (such as roads and intersections) and non-navigable features, such as lakes, etc. The geographic database may also include data subsets for places 144 (e.g., cities, states, counties) and postal codes 143. A geographic database may be defined with fewer or more subsets than these, and other types of data 146 may be defined and included.

Each subset of data includes only the data required to be used by a particular navigation function. There is some overlap of data between each of these subsets, with the result that some parts of the information may be included in more than one subset. For example, both a road segment data entity in the routing data subset 136 as well as a road segment data entity in the cartographic data subset 137 may include attributes identifying the nodes located at the ends of the segments. Although this duplication may result in a larger overall data storage requirement, each of the navigation functions benefits from the resultant efficiency of handling smaller amounts of data.

Providing for separate subsets of geographic data for each of the navigation functions also takes into account that usage of each of these navigation functions relates to the others of the navigating functions in expected ways. For example, an end-user may first want to view a present position, then enter a destination, then receive instructions how to start toward the destination, then observe a map showing the initial portion of the route, then receive further instructions, then have a map displayed of the next portion of the route, and so on. Because of this type of expected usage, dividing the data into subsets provides for efficient use of the data when using each separate function.

Although the division of the geographic data into subsets provides for efficient use of the data by each of the different navigation functions, it becomes necessary to provide that the different navigating functions that use these different subsets of the database work together. For example, in the example mentioned above, after an end-user obtains a calculated route, it may be desired to display a map on a computer display with the calculated route highlighted. In order to accomplish this, the routing subset 136 of geographic data is accessed first to obtain the routing road segment data entities for the optimum route, and then the cartographic subset 137 of the geographic database is accessed to obtain the cartographic road segment data entities corresponding to the routing data entities. To permit these data subsets to work together, indices may be included that provide cross references, search trees, or other data finding techniques. Indices can be located within any of the subsets of data or external of any of the subsets. In FIG. 4, external indices 147 are shown. Storing indices external of the data that are being indexed has the advantage that the index can be loaded and used to determine which data among the various subsets of data needs to be loaded next.

C. Layering of Geographic Data

Another way that the geographic data can be organized to enhance their use is to provide the data in layers. Some of the navigation functions, such as the map display function and the route calculation function, may use data at different levels of detail. For example, when using the map display function, it is sometimes desired to provide for panning and zooming. Zooming can be done more efficiently if the data are organized into layers, with greater detail at the lower layers and less detail at the higher layers. Likewise, when using the route calculation function, it is also advantageous to use the data at different levels of detail. For example, when calculating a route between two locations, it would be inefficient to examine all the possible road segments that diverge from each intersection along the route, including secondary streets and alleys. Instead, once a route is "on" a main road or expressway, it is generally preferable to stay on main roads or expressways until it is necessary to exit to secondary roads as the destination is approached. If the routing data are layered, higher layers that omit secondary roads can be used when possible to minimize the possible road segments to be investigated when calculating the route. Therefore, within some of the subsets of data types, the geographic data are provided in separate collections or groups corresponding to separate layers.

To implement layering, each road segment data record in the map database 40 also identifies the rank of the corresponding portion of the roadway that it represents. A rank of a road segment may correspond to its functional class. Road segments having a rank of "4" may include high volume, controlled access roads, such as expressways and freeways. Road segments having a rank of "3" may be high volume roads with few speed changes, but are not necessarily controlled access roads. The lower ranked roads handle corresponding lower volumes and generally have more speed changes or slower speeds. Roads having a rank of "0" can handle the lowest volumes. For example, these roads lowest ranked roads may include side streets, alleys, etc.

The rank of a road segment data entity also specifies the highest data layer in which a road segment entity is included. For example, referring to FIG. 5, the routing type data 136 may include five separate layers of the data, R0, R1, R2, R3, and R4, each comprising a separate collection of the routing data with a different level of detail, which can be used by the route calculation function. In the routing data type of the geographic database, layer 0 ("R0") includes the road segment data entities (and some or all of their corresponding routing data attributes) having a rank of "0" or higher. Thus, layer 0 includes road segment data entities corresponding to all the portions of all the roads in the geographic region. Layer 1 of the routing data 136 comprises a separate subset (or collection) of the routing data and includes only the routing segment data entities (and some or all of their corresponding routing data attributes) having a rank of "1" or higher. Layer 2 of the routing data comprises a separate subset of the routing data and includes only the routing segment data entities (and some or all of their corresponding navigation data attributes) having a rank of level 2 or higher, and so on. A highest layer (layer n) includes only records having a rank of n. In a present embodiment, n is equal to 4, although in other embodiments, n may be any number greater than 0. Each higher layer includes fewer records, however these records represent roads upon which travel is generally faster.

Similarly, the other types of data may include separate layers of data, each with a different level of detail. For example, the cartographic data type 137, which is used by the map display function 43, may be provided in multiple layers. Using different layers of cartographic data, the map display function 43 can provide rapid panning and zooming.

Figure 5:
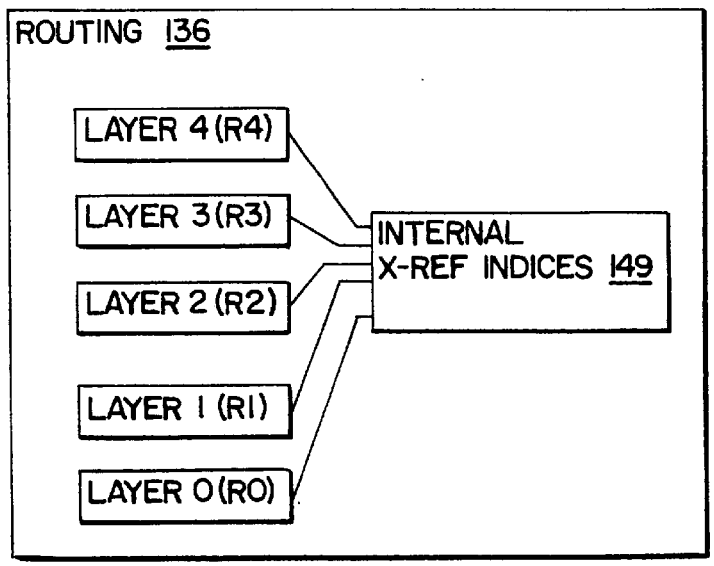
FIG. 5 is a diagram illustrating separate layers of data in the routing data shown in FIG. 4.

Although the organization of some of the data into layers results in some duplication of the data, the increased efficiency provided by layering generally offsets any disadvantages. As with the use of separate types of data mentioned above, the need arises to allow these layers to work together. Indices 149 may be provided for this purpose. In FIG. 5, internal indices 149 are shown. Internal indices 149 are included among the various types of data. External indices may also be used for this purpose.

D. Spatial Access to Geographic Data

Organizing the data into subsets or types provides separate collections of the data in sizes that are more manageable by each of the navigation functions 29 in the navigation application program. With respect to some subset types, the data can be further organized to facilitate spatial access.

Several of the navigation functions (e.g., 41, 42, 43, and 44 in FIG. 1) in the navigation application 18 may access or use the geographic data spatially. One way this arises is that a function in the navigation application program 18 requires finding a data entity record in the geographic database 40 given the physical location represented by the data entity in the geographic region. The data entity may be a road segment record that represents a portion of a road in the geographic region and the function may require finding the road segment record based upon the physical location in the geographic region of the portion of the road represented by the road segment record. The data entity may be a POI record that represents a hotel closest to the present position of a vehicle in which the navigation system is installed. Another way spatial access arises is when a function in a navigation application program requires finding several or all of a type of data records located close to a location in the geographic region or within a defined area in the geographic region. For example, a function may require all restaurant POI records encompassed within a rectangle defined by geographical coordinates (x, x+n) latitude and (y, y+m) longitude.

Referring again to FIG. 4, some of the subsets of geographic data are organized spatially and other subsets of data are organized in a manner other-than-spatially. Spatially-organized data are arranged so that the data that represent geographically proximate features are located logically and/or physically proximate in the data set 40 and/or on the medium 32. For some of the navigation application functions, spatial organization of their respective data provides for reading closely related geographic data from the medium more quickly and loading related geographic data into memory where they can be used. This kind of organization minimizes accessing of the storage medium 32 and speeds up operation of these navigation functions.

The subsets of the geographic data 40 that are organized spatially include the route calculation data 136, the cartographic data (map display) 137, and the point-of-interest data 139. Other kinds of data may also be organized spatially. Spatial organization can be applied to the data in different ways. For example, spatial organization can be applied to each record of data or can be applied to groupings of pluralities of data records (e.g., such as parcels of data, as explained below).

Some of the subsets of the data are organized and accessed in ways other than spatially. For example, some of the subsets of data may be organized alphabetically, or by city, state, and country, and so on. The non-spatially organized data include the junction data 140, the navigable feature data 141, the cartographic feature data 142, the postal code data 143, and the place data 144. Other types of data may also be organized non-spatially.

E. Parcelization of Geographic Data

There are several factors that can affect the operation and performance of a, navigation application program when using geographic data. In order to provide a reasonably high level of functionality, a relatively large database may be provided. Storage media, such as CD-ROM discs or PCM-CIA cards, are capable of handling databases of the size and complexity sufficient to provide suitable functionality. However, accessing these types of media can be relatively slow. Because navigation systems may be installed in vehicles, or may be hand-held, the hardware resources of the navigation system may be limited. Navigation systems installed in vehicles or hand-held units may have limited memory resources and relatively slow media access rates. Even when navigation applications are provided on platforms that have greater memory and hardware resources, similar considerations apply, but on a different scale.

Assuming that all the data records for a given entire geographic region cannot be loaded into the memory of the navigation system at the same time due to limited memory resources of the navigation system in which the navigation application program is being run, it would be desirable to load into memory only those data that are needed to perform a desired function. In order to accomplish this, data in the geographic database 40 are organized into parcels. A parcel of data is established to contain data records that are obtained together in a single access of the medium. This may relate to the quantity of data that can be accessed in a single disk access, although it may be related to some other factor. For some types of media such as a CD-ROM disks, a parcel may be established to be a 16 Kilobyte quantity of data. (Other sizes of data may be used including 1 K, 2 K, 4 K, 8 K, 32 K, and so on.)

As shown in FIG. 6, parcels 220 of data are stored to form the database 40 so that the data in each parcel 220 are logically and/or physically grouped together. When a parcel of data is accessed, all of its data records are read from the medium into the memory of the navigation system at the same time. Prior to forming the data into parcels, the data are first separately organized into the different types (e.g., routing, cartographic, maneuver, and so on, as shown in FIG. 4). In addition, for those types of data that are organized by layer (e.g., routing, cartographic), these types of data are separately organized into layers (as shown in FIG. 5) prior to forming the data into parcels.

(1). Parcelization of Spatially Organized Data.

In parcelizing data, it is preferable generally to form parcels of data in a manner that minimizes the number of parcels that have to be accessed and read in order to perform a navigation function. As mentioned above, it is sometimes desirable to store the data representing geographic features based upon the physical proximity of the features. With respect to the spatially organized data, it would be advantageous to provide a means to load data into memory based generally upon the physical geographic locations of the features which the data represent or upon the geographical proximity of the features which the data represent. This can be done by parcelizing the data spatially. Spatially-parcelized data are arranged so that the data that represent geographically proximate features are located logically and/or physically proximate in the database 40 and/or on the medium 32. For some of the navigation application functions, spatial parcelization of their respective data provides for reading closely related geographic data from the medium more quickly and loading related geographic data into memory where they can be used. This kind of organization minimizes accessing of the storage medium 32 and may speed up operation of these navigation functions.

There are a number of different procedures that can be used for parcelizing geographic data spatially. For example, a simple parcelization method may provide for separating the geographic data into a plurality of parcels wherein the data in each parcel represent features encompassed within a separate one of a plurality of regular sized rectangles which together form a regular, rectangular grid over the geographic region. Another method for spatial parcelization is to separate the data into parcels encompassed within rectangular areas where each of the rectangles is formed by a bisection of rectangles encompassing parts of the region until a parcel size below a maximum threshold is obtained. In addition, parcelization procedures are disclosed in the copending application Ser. No. 08/740,295, filed Oct. 25, 1996, the entire disclosure of which is incorporated by reference herein, and parcelization procedures are also described in the copending patent application Ser. No. 08/935,809, filed Sep. 5, 1997, the entire disclosure of which is incorporated by reference herein. Still other methods of parcelization to which the disclosed subject matter can be applied are described in U.S. Pat. Nos. 4,888,698 and 4,937,572.

Figure 7:
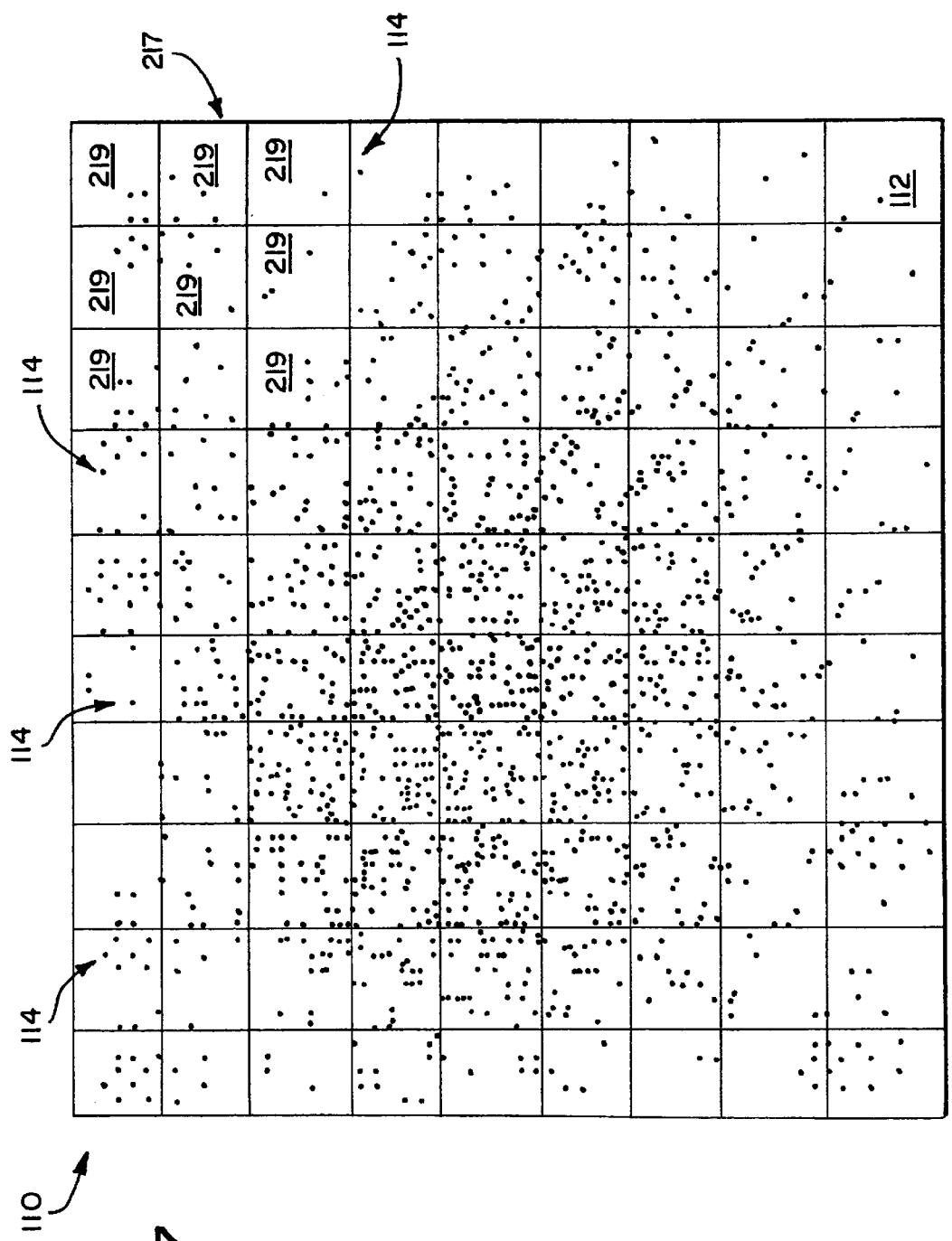
FIG. 7 shows a map of the geographic region of FIG. 2 illustrating application of a parcelization method to spatially organized geographic data.

Parcelization of spatially organized data is illustrated with reference to FIG. 7. FIG. 7 shows the map 110 of the geographic region 112, previously illustrated in FIG. 2. The plurality of positions 114 (represented by the dots or points) are shown to be located on the map 110. Each of the positions 114 represents a place or point in the geographic area 112 at which there is located a feature about which information is included in the geographic database 40 of FIG. 1. For example, the positions 114 may correspond to the physical locations of end points of road segments, points along road segments, points-of-interest (such as hotels, civic centers, etc.), and so on, which are represented by the data in the geographic database 40. Each of these locations 114 has a unique physical location (latitude, longitude, and optionally absolute or relative altitude) and each of the locations 114 can be uniquely identified by its two dimensional (or three dimensional) geographic coordinates (i.e., latitude, longitude, and optionally altitude).

In FIG. 7, a grid 217 overlays the geographic region 112 represented by the map 110. The grid 217 divides the geographic region 112 into a plurality of rectangular areas 219. The grid lines of the grid 217 represent the boundaries of rectangular areas 219. These rectangular areas 219 may be all the same size or may have different sizes depending upon the procedure used for parcelization. Likewise, the locations of the boundaries may depend on the parcelization procedure used. In general, when using any of the procedures for spatial parcelization, the data records of a particular type of data which represent features that are encompassed within each rectangular area 219 are grouped together in a separate parcel of data. Referring again to FIG. 6, the plurality of data records, such as road segment records and node records that comprise the routing subset 136 of the geographic database 40, are separated into groupings (i.e., parcels 220). With respect to the spatially organized data, each parcel 220 of routing data in FIG. 6 includes data records which represent the geographic features encompassed within a separate one of the plurality of rectangles 219 shown in FIG. 7.

As shown in FIG. 6, the parcels 220 are then stored to form the database 40 so that the data in each parcel 220 are logically and/or physically grouped together. Since the parcel represents a quantity of data records that are accessed at the same time by the navigation system, when a parcel of data is accessed, all of its data records are read into the memory of the navigation system at the same time. With reference to the map 110 of FIG. 7, this means that all the data records, such as the segment records or node records, of a spatially organized type of data that represent geographic features encompassed within each rectangle 219 are accessed together as a group. It can be appreciated that for certain kinds of navigation functions, it is desirable to have in memory at the same time all the data records that represent features that are physically close together in the geographic region.

As the parcels 220 are formed for these types of data, the parcels are ordered. Various types of ordering may be used. In general, it is preferred that the parcels be ordered in a manner that minimizes searches for data. One way to order spatially organized parcels is to use a depth-first ordering from a kd-tree index within each type of data. This provides an ordering similar to Peano-key ordering. Parcels may be stored on disk (i.e., medium 32 in FIG. 1) in this approximate Peano-key order. One or more indices, such as a kd-tree, can be used to access parcels spatially. This index is useful for initial location of an arbitrary position, such as when a program in a navigation system initially locates the map data corresponding to a current vehicle position. As the parcels 220 are ordered, each may also be assigned a unique parcel identifier (e.g., a "parcel ID"). The parcel ID may be used to identify the parcel and/or its location on the medium.

(2). Parcelization of Non-Spatially Organized Data.

Some kinds of data are not spatially organized. Parcelization may provide advantages for these kinds of data as well. Each parcel of non-spatially organized data does not necessarily correspond to any of the rectangular areas 219 in FIG. 7. For example, the navigation feature data 141 that represents the names of navigable features, such as streets and intersections, may be organized alphabetically instead of spatially. Also, place data 144 are among the kinds of data that are not spatially organized. Place data 144 are organized by administrative hierarchy. Place data 144 includes place data records which are used to represent governmental or administrative areas, (e.g., countries, cities, states, counties, zones, settlements, and so on). Place data 144 are organized in a hierarchical manner that takes into account the administrative levels of the places represented by the data. Once the place data records are organized in this hierarchical manner, they are formed into parcels 220 (in FIG. 6) and stored to form the geographic database. (Since the place data entities are not spatially organized, each parcel of place data does not necessarily correspond to any of the rectangular areas 219 in FIG. 7.)

According to one embodiment, place data are arranged by levels which correspond to the administrative hierarchy.

Level 1 place data records (i.e., those corresponding to the "countries" whose geographic features are represented by the geographic database 40) are included first in the place data 144. If more than one country is represented by the geographic database (e.g., Canada and the United States), the level 1 records are ordered alphabetically.

Next, all the level 2 place data records (i.e., those corresponding to the "states" in the U.S. or "provinces" in Canada) whose geographic features are represented by the geographic database 40 are arranged. These place records are ordered first according to which of the countries represented by level 1 records they are a part of, and then once they are sorted by country, they are sorted alphabetically. Thus, if the geographic database includes Canada and the United States, all the place data records that represent provinces of Canada are arranged in alphabetical order first followed by all the place data records that represent states of the United States arranged in alphabetical order. (Note that the geographic database does not necessarily include all the states or all the provinces. Only those that are represented by the geographic database are included.)

Next, all the level 3 place data records (i.e., those corresponding to the "counties" in the U.S. and Canada) whose geographic features are represented by the geographic database 40 are arranged. These place records are ordered first according to which of the states (or provinces) represented by level 2 records they are a part of, and then alphabetically. Thus, if the geographic database includes Illinois and Iowa, all the place data records that represent counties of Illinois are arranged in alphabetical order first, followed by all the place data records that represent counties of Iowa arranged in alphabetical order.

Finally all the level 4 place data records (i.e., those corresponding to the "cities" in the U.S. or Canada) whose geographic features are represented by the geographic database 40 are arranged. These place records are ordered first according to which of the states (or provinces) represented by level 2 records they are a part of, and then alphabetically. Thus, if the geographic database includes Illinois and Iowa, all the place data records that represent cities of Illinois are arranged in alphabetical order first, then followed by all the place data records that represent cities of Iowa arranged in alphabetical order.

The parcelization of place data described above represents one way that these data records can be organized. Other kinds of organization may be used. For example, other kinds of hierarchical arrangements may be used for the place data. Alternatively, the place data records may be spatially organized like the point of interest data.

F. Ordering of Parcels

As the parcels are formed for all the types of data and for all the layers of each type, the parcels are ordered. Various types of ordering may be used. In general, it is preferred that the parcels be ordered in a manner that minimizes searches for data. In some of the functions in a navigation application program, there is sometimes a requirement to access data that represents features along routes or paths across parts of the geographic region. This may occur when calculating a route across the geographic region or when panning across the region. Sometimes these routes or paths extend over more than one of the rectangles from which the parcels of data were formed. Accordingly, starting with data in one parcel, there is a requirement for accessing the data in another parcel formed from a rectangle which is located adjacent to the rectangle from which the first parcel was formed. Since each rectangle may have several other rectangles adjacent to it, there is a need for ordering the parcels formed by the rectangles to minimize searches.

One way to order parcels is to use a depth-first ordering from the kd-tree index within each parcel type and layer. This provides an ordering similar to Peano-key ordering. Alternatively, Peano-key ordering may be used. This ordering of the parcels provides the advantage that in general when going from one rectangle to an adjacent rectangle, the distance that the head moves when reading data from the storage media when going from the parcel corresponding to the one rectangle to the parcel corresponding to the adjacent rectangle is minimized. In general, this has the result of minimizing the seek time for finding the data in parcels that correspond to adjacent rectangles in the geographic region. The parcels formed by the other parcelization procedures can be ordered similarly.

Essentially, the parcels are ordered in the order in which they are formed. This is in reverse order from which the divisions are made that are used to form the rectangles from which the parcels are made. (In a present embodiment, for every division line made when forming rectangles, all data to west or south of the division line are formed into parcels before data to the east or north of division line.)

Each of the parcels so defined is assigned a "parcel ID." The parcel ID is a identification (e.g. a number) by which the parcel can be identified and it can be used to refer to the parcel when necessary to retrieve the parcel or any of the data contained therein. In one embodiment, the parcel ID's are assigned to the parcels in the same order in which the parcels are formed and in the same order in which the parcels are ordered in the database. This has the advantage that, knowing the size of the parcels, the parcel ID can be chosen so as to be used as an offset from the beginning address of the database file to locate the position of the parcel on the media.

G. Using Features of the Geographic Database.

Some or all of the features described above can be implemented in a geographic database to enable improved performance by a navigation application program that uses the geographic database. These features provide for improved performance by arranging and/or organizing the portions of the geographic data in ways to facilitate access to or use of the data in the geographic database for performing certain navigation functions. In order for a navigation application program to benefit from some or all of the performance enhancing features provided by the geographic database, the navigation application functions in the navigation application program that use or access the geographic database may be required to be written to exploit the features.

For example, the route calculation function 41 (in FIG. 1) may calculate a solution route by examining potential routes from each intersection between a starting point and a destination location. The route calculation subprogram may be able to determine a solution route more quickly if it can limit the examination of potential routes to those road segments that have, in general, the fastest speed limits and/or greatest capacities. To provide for this kind of limited examination, the geographic database can be organized into layers, as mentioned above in connection with FIG. 5. When the routing data are organized into layers, higher ranked (and generally faster) roads are organized into physically separate collections (or layers). However, the higher layers, though generally faster, are also generally less detailed and may not be appropriate for use throughout the entire route calculation process, such as at the starting or ending portions of a route.

In order to take advantage of this layering arrangement feature of the routing data 136 in the geographic database 40, the route calculation subprogram 41 can include an appropriate command or routine that determines which layers of the routing data 136 should be used at various stages of the route calculation process. The route calculation function 41 may use suitable logic or algorithms to determine which layers should be used at which stage of the route calculation process based upon various factors. Then, depending upon the determination of the appropriate layer, the route calculation function 41 (or another subprogram in the route calculation program) makes an appropriate function call or command to indicate from which layer the routing data should be retrieved. Therefore, in order for the logic or algorithms in the route calculation subprogram to take advantage of the layering in the routing data 136, it may be necessary to take into account the number of different layers in the routing data and the level of detail in each layer.

Other subprograms in the navigation application also may be required to be prepared with the features of the geographic database taken into account. For example, in order to display a particular section of the geographic area on a display screen, functions in the navigation application program may be required to be able to translate the geographic coordinates of the area desired to be displayed into an identification of the parcels that contain the cartographic data needed to represent the area. The identification of the parcels on the medium that contain the cartographic data may be provided by a library of interface layer functions that facilitate the translation of spatial coordinates into an identification of parcels using indices prepared as part of the geographic database.

III. Data Compression of a Geographic Database

A. Overview.

According to one present embodiment, a data compression method is disclosed. The data compression method may be used to compress a collection or stream of data. The data compression method disclosed herein may be used with various kinds of data.

In accordance with an aspect of this disclosure, a data compression method is applied to a geographic database to form a compressed version of the geographic database. This compressed version of the geographic database can then be stored on a physical medium. Using data compression in this manner provides for more efficient storage of the geographic data on a medium. Using data compression in this manner allows a medium, such as a CD-ROM disk, a DVD disk, or another type of medium to be developed in the future, to contain a geographic database that represents a larger coverage area than could be contained without compression. Alternatively, using data compression in this manner allows a storage medium to include more detail (i.e., more data) relative to a given coverage area. In another alternative, using data compression as described herein allows a data storage medium to include additional kinds of data that supplement the geographic database. Such additional kinds of data may include restaurant guides, graphics data, audio data, and so on. Using data compression may also improve the performance of a navigation system by reducing the number of media accesses required to obtain all the data necessary to perform a navigation function.

According to embodiments disclosed herein, data compression is used to store a geographic database in a manner that is consistent with the features such as those described above that can be incorporated in the geographic database and that enhance performance of the navigation application functions. Thus, using data compression embodiments, as described herein, allows more geographic data to be stored on a medium while continuing to implement some or all of the features in the geographic database that facilitate access and use of the data by functions in a navigation application program that use the data in the geographic database. By way of example, data compression is used in the geographic database while maintaining the organization of the geographic data by type. Further, data compression is used while maintaining the organization of the geographic data into layers within some of the types. In addition, data compression is used while maintaining the organization of the geographic data into parcels having a relatively high fill percentage. According to one present embodiment, data compression is used in conjunction with any or all of the other features and techniques that are incorporated into the geographic database that enhance the access and use of the geographic database for navigation functions.

According to one preferred embodiment, the compression and decompression of the geographic data are transparent to the navigation application program functions that access and use the geographic data (such as the route calculation function 41, the route guidance function 42, the map display function 43, the vehicle positioning function 44 and any of the other navigation functions 45, in FIG. 1). One way to provide for this advantage is to include a separate decompression function to perform the decompression of the geographic data. The decompression function may be included in the navigation application program as a separate function that operates independently from the rest of the functions in the navigation application program that access and use the geographic database. The decompression function operates at the time when the geographic data are being read from the medium and decompresses the geographic data from the compressed format in which they are stored on the physical medium. The decompression function then provides the geographic data in an uncompressed form to other functions which operate on the geographic data as if they were uncompressed. An advantage of implementing data compression in this manner is that the functions in the navigation application program can continue to use the geographic database without incorporating any modifications to take into account that data compression has been applied to the geographic data. A further advantage of this kind of implementation is that the decompression function can be configurable so that it is executed only when needed. Because some navigation systems allow the medium upon which the geographic database is stored to be changed (e.g., for updating purposes or to install a geographic database for a different coverage area), the decompression function is executed only upon detection at initialization that some or all of the data in the geographic database on the medium are compressed.

The decompression function may be included among a library of data access functions that are used to retrieve geographic data from a physical medium and return the geographic data to the navigation application functions that use the data. An example of such a library of data access functions is described in U.S. Pat. No. 6,047,280, the entire disclosure of which has been incorporated by reference herein. When implemented in this manner, the decompression function is separate from the navigation functions (e.g., 41, 42, 43, 44, 45 in FIG. 1) that use the geographic data. Although the decompression function may be a separate function from those navigation functions that use the geographic data, the decompression function may be linked, along with the other functions that access the geographic data from the medium, with the navigation functions that use the data to form a single executable program.

B. Types of Geographic Data Compressed

According to one embodiment, all of the data in the geographic database is compressed using one or more of the compression techniques described below. In alternative embodiments, only some of the types of geographic data are compressed while the remainder of the types of geographic data are not compressed. For example, referring to FIG. 4, the routing data 136 and the cartographic data 37 may be stored in compressed form on the medium, while the point-of-interest data 139 and place data 144 may be stored in uncompressed form on the medium. According to still another alternative, some of the types of data may be stored in compressed form using all of the compression techniques described below, while other types of data may be stored in compressed form using only some of the compression techniques. According to yet another alternative, some of the types of geographic data are compressed using some or all of the compression techniques described below, while others of the types of geographic data are compressed using different types of compression techniques, including conventional compression techniques.

C. Data Compression Implementation

In a present embodiment of the compressed geographic database, compression techniques similar to conventional Huffman and LZ type substitutional compression are used. However, the manner in which the geographic database is compressed differs from conventional implementations of these techniques. The differences can be understood from the description set forth below.

In conventional Huffman compression, a collection (or stream) of data to be compressed is examined to determine which symbols (e.g., bytes) occur most frequently. Then, the symbols in the original data stream are replaced by codes of varying lengths. The shortest codes are used to represent the most frequently occurring symbols.

LZ data compression is a type of substitutional compression. LZ data compression has several variations. In one kind of LZ compression, a collection (or stream) of data is examined to find matching substrings of data symbols within the stream. When a substring of data symbols matches a previous substring of data symbols, the substring is replaced with a code that indicates the position of the previous string and an indication of the length of the previous string.

D. Substitution (LZ-type) Encoding Embodiment

It has been discovered that in embodiments of uncompressed geographic databases, such as—but not limited to—geographic databases formed according the methods described above, matching substrings of data are found to occur relatively frequently. Moreover, it has been discovered that in embodiments of uncompressed geographic databases, these matching substrings occur predominantly locally. For example, in the routing data 136 (in FIG. 4), substrings of data in the segment data records are found to match substrings of data in other segment data records which are located relatively nearby. Part of the reason why this occurs may be related to the characteristics of some or all of the geographic data. Alternatively, part of the reason why this occurs may be related to the way that some or all of the geographic data are organized to facilitate their use and access by the navigation application program. As an example, each parcel of spatially parcelized data includes data records that represent physical features that are encompassed within the boundaries of a separately defined rectangular area within the geographic region. Physical features that are located close together may have similar attributes. It follows then that the data records—which represent the physical features that are relatively close together—may have similar substrings of data. Other factors may contribute to these characteristics.

For example, consider four segment data records that represent successive segments of a north-south road. Each of these segment records may include a data field (or similar data structure) that includes the geographic coordinates of the endpoints of the road segment that is represented. Since all the points along these road segments, including the endpoints of each of these road segments, have the same longitude, the data fields for the endpoints in each of these segment records include the same strings of data. Similarly, if the speed limit along these four road segments is the same, the data fields in each of the four road segment records that represent the speed limits will all include the same strings of data. Since these road segments are adjacent to each other in the geographic region, the four data records in the spatially parcelized routing data that represent these four road segments are located in the same parcel in the geographic database on the data storage medium (unless a parcel boundary crosses the four road segments) and thereby these four data records are relatively close to each other in the geographic database.

In another example, in the maneuver data 138 (in FIG. 4), data records that represent successive segments of a road may have the same street name. Even though the data that includes the actual text string of the name of the road segment may be located in another portion of the geographic database (for example, in the navigable feature type of data 141), each of the segment data records in the maneuver data 138 may include a reference (or a pointer into an array in the parcel which in turn provides a reference) to the data record in the navigable feature data type 141 that contains the text string of the name of the represented road segment. Since the maneuver data 138 are spatially parcelized, these four road segment records in the maneuver data 138 that all include data that refer to the same street name are also relatively close together in the geographic database.

As suggested by the foregoing, some of the techniques used to enhance performance of certain of the navigation features may tend to bring into proximity in the geographic database those data records that represent geographic features that are relatively close together physically in the geographic region. Because geographic features that are relatively close together physically in the geographic region may share certain attributes which are represented by substrings of data in the geographic database, a geographic database formed using these performance enhancing techniques may have identical substrings of data relatively close together.

Because matching substrings among the geographic data in an uncompressed geographic database may occur with relative frequency, a type of substitutional compression is used. Where a substring of geographic data at a first position in the geographic data matches another, previous substring, the substring at the first position may be replaced with a substitution code. The substitution code includes an indication of the location of the previous substring in the geographic data. According to one embodiment, the indication used in the substitution code is a backwards offset from the position at which the substitution takes place (i.e., where the substring is replaced by the substitution code) to the position of the previously occurring matching substring. The substitution code also includes the size of the matching substring. This replacement is illustrated in FIG. 8.

(For purposes of this explanation, the uncompressed data that form a geographic database—as they have been ordered by type and layer—are taken to comprise an uncompressed stream or collection of geographic data. A first (or current) position in such a data stream is taken to mean any arbitrary position in the geographic data stream at which data are located. A previous position is taken to mean a position in the data stream relative to the first position such that the data at the previous position have already been accessed by whatever means the data at the first position are now being accessed.)

The offset in a substitution code is a number which is defined within a range of values. This range is determined by how many bits are used to represent the offset. The allowable range of values for an offset determines how far back from a current position the matching substring can be located. In one embodiment, an 8 bit number is used for the offset, so the range of values for the offset is 1–256. If an 8 bit number is used for the offset (and if offsets as small as "1" are permitted), a matching substring cannot be located more than 256 characters back from the current position. This implies that when searching for matching substrings, only the 256 characters immediately preceding the current position are examined for matches. (This assumes that offsets as small as "1" are permitted. It might be preferred in alternative embodiments that offsets as small as "1" not be permitted. For example, if a minimum matching substring length is defined to be 4 characters, there will be no offsets less than "4" and therefore, the 8 bits of the offset can be used to define a range of 4–260.)

The offset can be defined to have a larger or smaller range of values. A larger range of values permits more of the preceding string of characters to be examined to find a matching substring for the substring of characters at a current position. For example, if a 9 bit number is used for the offset, the 512 immediately preceding characters (assuming the offset can be as small as "1") can be examined to find a matching substring. Offsets of different ranges of values can be used for different data types in the geographic database. For example, an 8 bit number can be used for the offset in the routing data and 9 bit number can be used for the offset in the maneuver data. In a present embodiment, the offset can be configurable for different types of data. In a present embodiment, the offset can be up to 12 bits (i.e., 4096). In alternative embodiments, even larger numbers can be used.

As mentioned above, it might be preferred to establish a minimum length for matching substrings. For example, the substring being evaluated for replacement at a position in a data stream may be required to be at least three, four, five, or more characters in length before it is considered a potential candidate for replacement by a substitution code that refers to a previously occurring matching substring. A minimum length for matching substrings may be established to avoid replacing relatively short substrings, e.g., substrings of only one or two characters in length, with substitution codes. Replacement of relatively short substrings may provide little, if any, overall data compression benefits. In a preferred embodiment, the minimum length for matching substrings is configurable so that it can be set to any value. The minimum length for matching substrings may be configured to different values for different data types. For example, the routing data may have a minimum substring length of one value and the cartographic data may have a minimum substring length of another value. The minimum substring may be determined automatically by the program that compresses the data.

E. Run Length Counts

Using substitution codes to replace strings of characters can provide for significant compression of a collection of data, and in particular geographic data stored on a geographic database. When substitution codes are inserted into a collection of data to replace strings of data, a way is used to distinguish those characters in the compressed data that are substitution codes from the remainder of the data which are not replaced by substitution codes. A code can be inserted adjacent to (before, or alternatively after) each character in the collection of compressed data to indicate whether the adjacent character is a substitution code or is non-substituted (i.e., "literals") data. For example, a single bit (referred to herein as an "LZ/literal flag") can be used for this purpose. According to this example, if the LZ/literal flag preceding a character in the collection of data is "0," this data character is non-substituted (i.e., "literal") data. Alternatively, if the LZ/literal flag preceding a character in the collection of data is a "1," this data character is part of a substitution code. (Of course, the 0's and the 1's can be used vice versa.)

Instead of using a code associated with each character in the compressed collection of data to indicate whether the character should be understood to be a substitution code or non-substituted (i.e., "literal") data, run length counts can be used. Using run length counts avoids the need to precede each character in the collection of data with a code that indicates whether the character is a substitution code or is non-substituted ("literal") data. Using run length counts also potentially reduces the overall data storage requirements. To use run length counts, a run length count code is inserted at the beginning of each string of non-substitution code characters. The run length count code is a number that corresponds to the number of consecutive characters in the collection of data that are literal characters, i.e., not a substitution code, starting from the position at which the run length count code is located. In one present embodiment, the LZ/literal code (i.e., the one bit set to "0") indicating that the adjacent characters are literals is associated with the run length count, but is omitted from the subsequent literal characters that follow the run length count.

The run length count is defined to have a range of values. In a present embodiment, the run length count is seven bits. This enables a run length count to define a number of subsequent consecutive literal characters between 1 and 128. This range is adequate for a collection of data in which matching substrings are expected to occur relatively close together. If it is desired to have a run length count with a greater range of values, a larger number of bits can be used for the run length count. Alternatively, if a string of consecutive literals occurs that is greater than 128 characters in length, more than one run length count can be used. For example, to account for a string of 200 consecutive literals, a first run length count indicating a subsequent string of literals having a length of 128 can be inserted at the beginning of the string and a second run length count indicating a subsequent string of literals having a length of 72 can be inserted after the $128^{th}$ literal character.

In an alternative embodiment, the run length count can be defined to have a smaller range of values (i.e., less than 7 bits).

F. Encoding the Substitution Code and Run Length

Figure 9A:
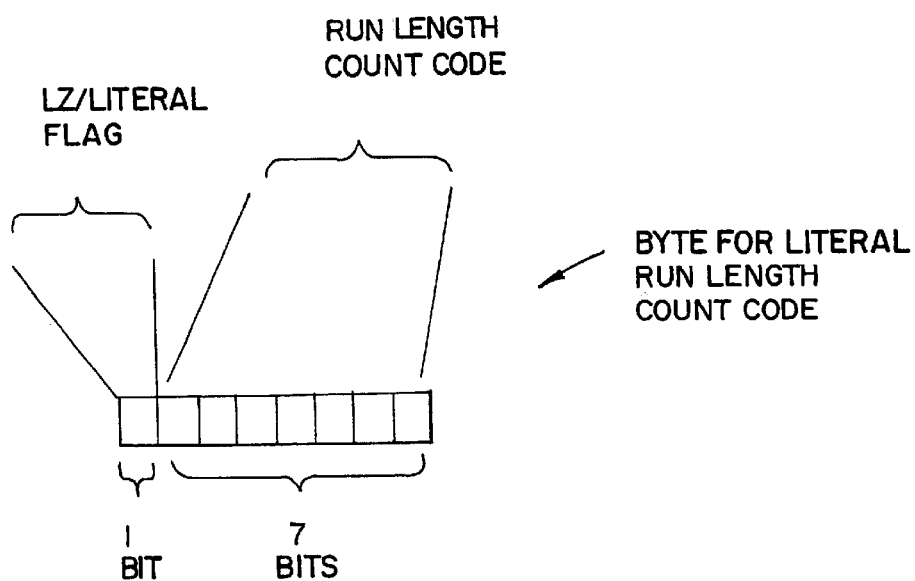
FIGS. 9A and 9B are diagrams illustrating embodiments of the run length counts and the substitution code.
Figure 9B:
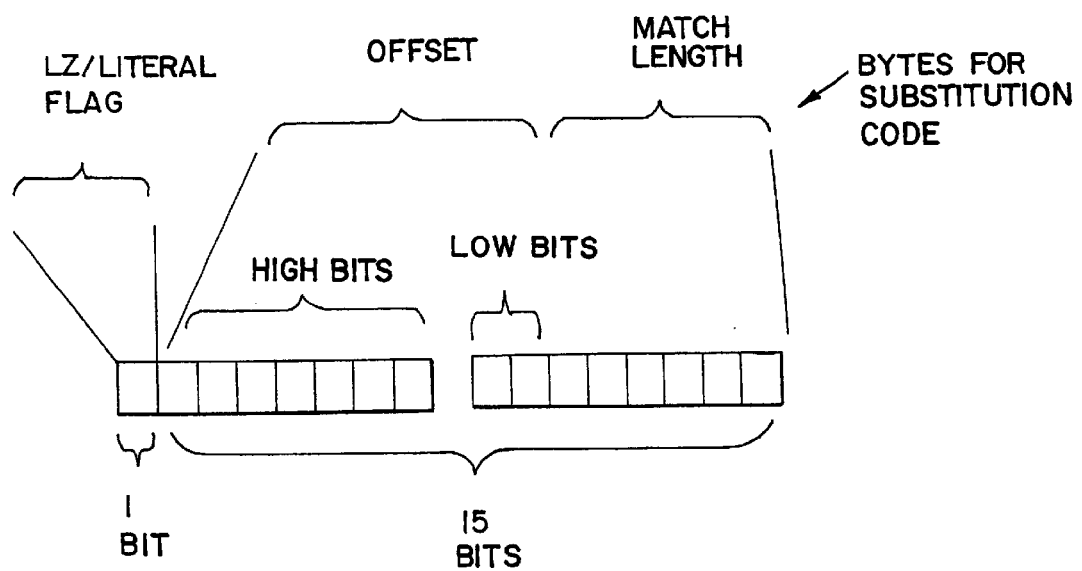

In a present embodiment, two bytes are used for each substitution code (including the LZ/literal one bit flag that indicates that the immediately subsequent data is a substitution code) and one byte is used for the literals run length count (including the LZ/literal one bit flag that indicates that the data is not a substitution code). FIGS. 9A and 9B illustrate the components of these codes. In FIG. 9A, the one byte used for the literals run length count includes the one bit LZ/literal flag (which is set to indicate that literals follow). The remaining 7 bits of this byte are used for the run length count itself. Referring to FIG. 9B, the two bytes used for the substitution code include the one bit LZ/literal flag (which is set to indicate that a substitution code follows). The remaining 15 bits of these bytes are used for the offset and the match length of the substitution code. The allocation of these 15 bits between the offset and the match length is configurable. If 8 bits are used for the offset, 7 bits remain available for the match length.

The bits that comprise the offset can be divided between the two bytes used for the substitution code. The 7 high bits of the offset are included in the first byte along with the one bit used for the LZ/literal flag. The remaining (low) bits, if any, of the offset are included in the second byte along with the bits used for the match length. If 8 bits are used for the offset, the high 7 of these bits are included in the first byte in FIG. 9B and the one low bit of the offset is included in the second byte along with the 7 bits used for the match length. As mentioned above, the match length is configurable. According to one embodiment, a match length of 7 bits is used in the routing data and a match length of 6 bits is used in the maneuver data. The allocation of bits between match length and offset can be varied to determine the allocation that provides the best compression for a type of data.

G. Huffman Encoding

In addition to the use of substitution codes that are inserted in positions in a geographic database to reference previous matching substrings and run length counts to indicate the lengths of consecutive literal (non-substitution code) characters, the amount of storage occupied by the geographic database can be further reduced by Huffman encoding. In a present embodiment, the substitution codes, the run length counts, and the non-substituted data in the geographic database are Huffman encoded.

Huffman encoding exhibits the best compression when the data being encoded are least random, i.e., when certain data items occur significantly more frequently than other data items. Thus, better compression can be obtained by identifying portions of the entire collection of data that exhibit the least randomness and then encoding these portions separately from the other portions. In a preferred embodiment, the components of the substitution codes (specifically, the offset and the match length), the run length counts, and the non-substituted data in the geographic database are separately analyzed for most frequently occurring values. Then, each of these components is separately encoded using separate Huffman trees.

As mentioned above, each substitution code includes two components: the offset portion and the match length (i.e., the length of the matching substring) portion. With respect to the offset portion, it was also mentioned above that the matching substrings of data in the geographic database are likely to be relatively close together. This tendency is expected to be exhibited especially within each type of data, e.g., routing 136, cartographic 137, maneuver 138, and so on, in FIG. 4. Therefore, it is expected that the offsets in the substitution codes will tend to point to positions which are relatively close to the positions at which their respective substitution codes are located. Given the range of values defined for the offsets, it is expected that the offsets will exhibit clustering in the lower end of their value range. Again, this is expected to occur because many of the offsets are expected to be relatively small numbers within the range. Thus, small numbers within the range are likely to occur more frequently than large numbers and the same small numbers are likely to occur repeatedly.

As the offsets (particularly in their upper most-significant bits) are not expected to exhibit a random distribution within the defined range of values, data compression can be employed to the offset values thereby reducing the overall data storage size requirements for the offsets. Huffman coding can be used for this purpose. As offsets are determined for each type of data to be compressed, the offsets are examined to determine which offset values occur most frequently. A Huffman-type statistical analyzer, known to those of skill in the art, may be used for this purpose. As mentioned above, since it is expected that matching substrings will be located relatively close together, smaller numbers are expected to occur more frequently for the offsets than larger numbers.

(Referring again to the Huffman encoding of the offsets, there are several alternative ways that a Huffman-type encoding can be used on the offsets. For example, the entire value of the offset can be statistically analyzed and Huffman encoded. Alternatively, only a portion of the offset, such as only the most significant bits, can be statistically analyzed and Huffman encoded. In addition, the offsets for the different types of geographic data can be Huffman encoded differently. For example, only the most significant bits of the offsets can be Huffman encoded in the routing data, whereas all the bits of the offsets can be Huffman encoded in the cartographic data. Likewise, portions of a type of data can be Huffman encoded differently. For example, only the most significant bits of the offsets can be Huffman encoded for some of the parcels of routing data and all the bits of the offsets can be Huffman encoded in others of the parcels of routing data. In an embodiment in which only a portion of the offset is statistically analyzed and Huffman encoded, the remaining portion of the offset which is not encoded can be inserted in uncompressed form in the bit stream after the Huffman code for the most significant bits of the offset.)

The other component of the substitution code is the match length portion. This component identifies the size (i.e., the length) of the matching substring that replaces the original string of characters at the location of the substitution code. The values of the sizes of the matching substrings are also unlikely to have a random distribution within the range of values defined for this component of the substitution code, particularly within a type of data. Thus, the match length component of the substitution code can be compressed by encoding the values of the match length using Huffman encoding. Using the Huffman statistical analyzer, all the values of the sizes of match lengths are analyzed to determine which match length values occur more frequently and which occur less frequently.

Likewise, the run length counts can be compressed. The run length counts identify the number of subsequent characters that are literals. Like the components of the substitution codes, these codes can be compressed by encoding them using the Huffman statistical analyzer. All the values of the sizes of the run length counts are analyzed to determine which run length count values occur more frequently and which occur less frequently.

Lastly, the literal characters themselves can be compressed by encoding them using the Huffman statistical analyzer. Literal characters typically exhibit some clustering of values. All the literal characters that occur in each type of data are analyzed to determine which literal characters occur more frequently and which occur less frequently. (In the embodiment mentioned above in which only a portion of the offset is statistically analyzed and Huffman encoded, the remaining portion of the offset which is not encoded can be inserted in uncompressed form in the bit stream between the Huffman code for the most significant bits of the offset and the Huffman code for the match length.)

H. Building Huffman Trees

In a present embodiment, the offset lengths (all or only a portion thereof, such as only the most significant bits thereof, as mentioned above) and match lengths in the substitution codes, the run length counts, and the literal characters themselves are separately encoded. These components of the data can be encoded using three Huffman trees. One specific implementation for encoding these aspects of a geographic database is explained below.

First, after the non-substituted data in the geographic database (i.e., the "literals") are statistically analyzed to determine the most frequently occurring characters, a Huffman tree is built that associates the most frequently occurring literal characters with the shortest Huffman codes. Using this tree, the literal characters are replaced using the Huffman codes associated with them. This tree can be stored with the compressed database so that when a navigation application requires the data, the original data characters can be restored from the Huffman codes using this Huffman tree. The literal characters in each type of data, e.g., routing 136, cartographic 137, maneuver 138, and so, can be separately encoded.

Next, as mentioned above, the run length counts can be statistically analyzed to determine the most frequently occurring values for the run length counts. More specifically, the run length counts including the LZ/literal bit flag, illustrated in FIG. 9A, are analyzed to determine the most frequently occurring values for this combination of LZ/literal bit flag and run length counts. The statistical analysis for the run length counts is conducted separately from the statistical analysis of the literal characters because the run length counts are expected to exhibit a clustering of values that is different than the clustering exhibited by the literal characters. Also, the statistical analysis for the run length counts can be done separately for each type of data because each type of data may exhibit distinct clustering of values, and therefore better compression can be obtained by separately analyzing each type of data Another Huffman tree is built that associates the most frequently occurring run length count values with the shortest Huffman codes. Using this tree, the run length counts (including the LZ/literal bit flag) are replaced using the Huffman codes associated with them. This second tree can then be stored with the database so that when it is required to use the data, the original run length values can be restored from the Huffman codes.

As also mentioned above, the offset portions of the substitution codes are statistically analyzed to determine the most frequently occurring values for the offsets. More specifically, the first byte of the substitution code, which includes the LZ/literal bit flag and the high bits of the offset as illustrated in FIG. 9B, is analyzed to determine the most frequently occurring values for this combination of codes. The statistical analysis for the offset codes (specifically, the LZ/literal bit flag and the high bits of the offset) is conducted separately from the statistical analyses of the literal characters or the run length counts because the offset codes are expected to exhibit a different clustering of values than those exhibited by the literal characters and run length counts.

The same Huffman tree used for the run length counts (more specifically, the run length counts including the LZ/literal bit flag) is used for the offset codes (specifically, the LZ/literal bit flag and the high bits of the offset). The most frequently occurring values for the offset codes (specifically, the LZ/literal bit flag and the high bits of the offsets) are associated with the shortest Huffman codes. Then, using this tree, the offset codes (specifically, the LZ/literal bit flag and the high bits of the offsets) are replaced using the Huffman codes associated with them. This tree is stored with the compressed database and is used to restore the offset codes when the navigation application requires using the data.

Lastly, as mentioned above, the match length portions of the substitution codes are statistically analyzed to determine the most frequently occurring values for the match lengths. More specifically, the second byte of the substitution code, which includes the low bits of the offset and the match length as illustrated in FIG. 9B, is analyzed to determine the most frequently occurring values for this combination of codes. The statistical analysis for the match length codes (specifically, the low bits of the offset and the match length) is conducted separately from the statistical analyses of the literal characters, the run length counts, or the LZ/literal bit flag and the high bits of the offsets because the match length codes may exhibit a different clustering of values than those other components of data.

A third Huffman tree is built that associates the most frequently values of the match length portions of the substitution codes (more specifically, the low bits of the offset and the match lengths) with the shortest Huffman codes. Using this tree, the match length portions of the substitution codes (more specifically, the low bits of the offset and the match lengths) are replaced using the Huffman codes associated with them. This third tree is stored with the database so that when it is required to use the data, the match length values can be restored from the Huffman codes.

As mentioned above, each type of data (i.e., routing 136, cartographic 137, maneuver 138, and so on) may exhibit distinct clusterings of values for these four kinds of data encoded by the three Huffman trees, as described above. In other words, when the Huffman statistical analyzer is run to find which values should be encoded with the shortest Huffman codes, separate statistical analyses are performed for the routing data, the cartographic data, the maneuver data, and so on. Then, separate sets of three Huffman trees are prepared for each of these different types of data. For example, there are three Huffman trees for the routing data: one for literals, a second for the LZ/literal bit flag and either the run length counts or the high bits of the offsets, and a third for the match length and the low bits of the offset. Likewise, there are three separate Huffman trees that encode these aspects of the cartographic data, three separate Huffman trees that encode these aspects of the maneuver data, and so on. Separate sets of three Huffman trees can be prepared for each of the different kinds of data.

In some embodiments of the geographic database, some of these different types of data may exhibit similar clusterings of values for some or all of these data components. For example, in one embodiment, the substitution code offsets in the cartographic data may exhibit similar clustering as the substitution code offsets in the routing data. Under these circumstances, the same Huffman tree for offsets can be used in both the routing data and the cartographic data. Similarly, others of the types of data may also share the same Huffman tree(s) for their offsets if the data in these other types of data exhibit similar clustering characteristics. Likewise, the other Huffman trees (e.g., literals, match lengths, run lengths) may also be shared among more than one type of data.

In still other embodiments, additional Huffman trees may be used for the same type of geographic data. For example, statistical analysis of one type of geographic data, such as routing, may indicate that some of the parcels of routing data should be Huffman encoded with one or more different Huffman trees than others of the parcels of the routing data. In such circumstances, different Huffman trees can be formed and used for these different parcels of routing data.

To reduce the data size requirements even further, the sets of Huffman trees for each type of data are not stored among the parcels of data which have been compressed. Instead, since all the parcels of a data type are expected to use the same Huffman trees, the Huffman trees for each type of data are maintained in a portion of the database separate from the compressed data. For example, the Huffman trees for each of the types of geographic data may be stored in a portion of global data. Storing the Huffman trees for each data type in a global portion of data separate from the compressed data that is Huffman encoded has several advantages. Aside from reducing the storage requirement associated with storing a Huffman tree in each parcel of data, when the Huffman trees are stored in the global data, they can be loaded into memory when the data type is being used by a particular function in the navigation application and used for all the parcels of the type to which it relates. This reduces the processing associated with using the Huffman trees and results in improved performance. For example, the Huffman trees for each type of data can be maintained in memory throughout the operation of the function that uses that data type.

EXAMPLE

An example of an embodiment of the disclosed data compression process is described with reference to FIG. 10. In this example, an uncompressed data stream "xztjxihgppcbscbagppcbacbs . . . " is shown. This data stream represents a contiguous portion of data. In one embodiment, the data stream is a portion of a geographic database although in alternative embodiments, the data stream may comprise a portion of any other kind of data.

FIG. 10 also shows a table. Each character in the original data stream is included in a corresponding entry in the second column of the table with each row of the table corresponding to an entry. The third column in the table shows an intermediate stage of the data stream during the compression process with the substitution codes, run length counts, and LZ/literal bit flags added, but prior to Huffman encoding. The fourth column illustrates application of the functions that are called to encode each of the entries in the second column using Huffman encoding. (The first column includes consecutive assigned numbers that identify the relative positions of each of the entries in the uncompressed data stream shown in the second column and the representations of the compressed data stream shown in the third column. The numbers in the first column are for illustrative purposes only and do not form part of either the compressed data stream or the uncompressed data stream.)

The compressed data stream is comprised of a plurality of entries, each of which is a Huffman code. The Huffman codes themselves are not shown in FIG. 10. Instead, the fourth column in FIG. 10 shows the functions ("huff1()", "huff2()", "huff3()") that are called to form the Huffman codes along with the arguments passed to the functions. The arguments passed to the functions include the literal character data, the substitution codes and the run length counts (including the LZ/literal flags) which are formed in an intermediate stage of compression and which are illustrated in the third column in the table in FIG. 10. The functions that are called to encode literal character data, the substitution codes and the run length counts replace each entry (i.e., the byte) in the third column with a corresponding Huffman code. The Huffman codes are obtained from the respective Huffman trees which have been built for this purpose by the statistical analysis of each of these data components. For purposes of this example, it is understood that the statistical analyses for each of these components (i.e., the literal character data, the substitution codes and the run length counts) has already been obtained and that the trees for each component have been built. Thus, in order to encode entries that form the compressed data stream, reference is made to these three Huffman trees. Likewise, in order to decode each entry in the compressed data stream to restore the original uncompressed data stream, reference may be made to these same three Huffman trees. Although there are three Huffman trees in a present embodiment, there may be more or fewer Huffman trees in alternative embodiments.

For the sake of simplicity, the match length is assumed to be 8 bits. This avoids the necessity to consider any low bits of the offset in the second tree.

Referring to the first entry in column 3 ("lit, 13"), this entry includes a LZ/literal bit flag and either the run length or the high bits of the offset. As mentioned above, this entry represents an intermediate stage of the compressed data stream. As indicated, the LZ/literal bit flag in this entry ("LZ") indicates that the subsequent data are literals. This means that the remainder of the data in this entry represents a value for a run length of literals. (The flag and run length correspond to the bits illustrated in FIG. 9A.) More specifically, this entry includes one bit indicating that the subsequent data are literals (e.g., a "0") and the bits (e.g., "0001101"=13) of the run length count indicating that the next 13 entries in the compressed data stream are Huffman codes for literals. This first entry is Huffman encoded using the third Huffman tree, as shown in the first entry in the fourth column of the table. (This Huffman tree is arbitrarily referred to as the "third" tree.)

The Huffman code for the value "0" plus "13" was derived by statistical analysis. The statistical analysis used to generate the Huffman code for the value "13" in the third Huffman tree is based upon the frequency that the number "13" occurs as a length for a string of consecutive literals.

Following the initial Huffman code are the 13 Huffman codes for the 13 literals. Each Huffman code that represents a "literal" represents only one character in the original data stream. This means that each of the these next 13 entries in the compressed data stream is to be taken as a Huffman code representing an individual character of the original data stream. Since these next 13 entries are Huffman codes that represent literals, none of these 13 entries represents a substitution code for a matching substring in the data stream.

These 13 entries in the compressed data stream that are Huffman codes for literals are formed by replacing the original characters ("xztjxihgppcbs") with Huffman codes, as illustrated in the second through $14^{th}$ entries in the fourth column of FIG. 10. These Huffman codes are determined using a Huffman statistical analysis on all the individual characters in the data stream. (As mentioned above, in a present embodiment in which the compression method is applied to a geographic database, each particular type of data is separately subjected to a Huffman statistical analysis. Therefore, the routing data may have its own first Huffman tree, the cartographic data may have its own first Huffman tree, and so on.) The original characters represented by these 13 Huffman codes can be found in another of the Huffman trees (arbitrarily referred to as the "first" tree) so that in order to restore the original uncompressed data characters represented by these codes, the first Huffman tree is used.

Referring to the first of these 13 entries in the fourth column, ("huff1(x)"), this entry in the compressed data stream would be the Huffman code for the character "x." The first Huffman tree would be used to encode this entry, which is then added after the initial Huffman code, to form the compressed data stream. Similarly, the next entry in the compressed data stream would be the Huffman code for the character "z." Again, the first Huffman tree would be used to encode the entry at this location which is then added after the first two Huffman codes to form the compressed data stream. Similarly, the next 11 Huffman codes in the compressed data stream would be encoded using the first Huffman tree and then added after the other Huffman codes to form the compressed data stream corresponding to these first 13 characters.

Because the $14^{th}$ and $15^{th}$ characters in the original data steam ("cb") match the $11^{th}$ and $12^{th}$ characters in the original data stream, a substitution code is inserted in the compressed data stream to indicate that a substitution of a substring from the previous portion of the data stream occurs at this location. This substitution code is comprised of two bytes which are separately compressed using Huffman encoding. The first byte of the substitution code is comprised of the one bit LZ/literal flag and the 7 high bits of the offset. (This first part corresponds to the first byte of the substitution code in FIG. 9B.) Referring back to FIG. 10, the first part of this substitution code is represented by "lz, −3" shown at the entry at the $15^{th}$ position in the third column. Specifically, part of the substitution code includes the LZ/literal flag (e.g., a "1" indicating a substitution code) and the bits (e.g., "0000011"=3) of the offset indicating that the starting position of the subsequent matching string is 3 characters back. This entry is encoded using the third Huffman tree "huff3 (lz, −3)." The compressed data stream then includes the Huffman code from the third Huffman tree that corresponds to "lz, −3."

The next entry is the second part (i.e., byte) of the two byte substitution code. This part of the substitution code is represented by the "2" in the entry at the $16^{th}$ position in the third column. This second part of the substitution code includes the match length portion of the substitution code and the low bits, if any, of the offset. This second part corresponds to the second byte of the substitution code in FIG. 9B. Specifically, this part of the substitution code includes the bits ("00000010"="2") that indicate the number of characters at the location three characters back which are to inserted at this location when restoring the data to its original form. Using this code ("huff2(2)"), and the value ("−3") in the previous code ("huff3(lz, −3)"), a substring of characters in the original data stream is identified as matching. The two characters at the $14^{th}$ and $15^{th}$ position of the original data stream are not literally present in the compressed data stream. Instead, these characters are represented by the substitution code formed by the two Huffman encoded entries which form the substitution code. Specifically, these two Huffman encoded entries refer to the substring of characters starting from a location 3 characters back (offset="−3" from huff3(lz, −3)) which is 2 characters long in the previous occurring data stream (substitution string length="2" from huff2(2)).

Following this entry is another Huffman code ("huff2(2)"). This Huffman code is encoded using the second Huffman tree. This Huffman code represents the remainder of the substitution code, specifically the low bits, if any, of the offset which are not included in the previous code and the match length. The value of this code ("−3") indicates how many characters back to go from the position to get to the starting position of the matching substring.

Following this Huffman code, the next entry in the compressed data stream is a Huffman code ("huff3(lit, 1)"). Again, this code is obtained using the third Huffman tree. This code means that the next entry is a Huffman code which represents a literal character.

The next entry ("huff1(a)") in the compressed data stream is a Huffman code which represents the literal character "a" encoded using the first Huffman tree.

The next entry ("huff3(lz, 5)") in the compressed data stream is a Huffman code which represents a substitution of length "5" which is encoded using the third Huffman tree.

The next entry ("huff2(−9)") in the compressed data stream is a Huffman code which represents that the substitution of length "5" mentioned immediately prior starts 9 characters back, where the value "9" is encoded using the second Huffman tree.

The remainder of the data stream is encoded as indicated.

To decode the compressed data stream, the trees are used in reverse order from the encoding process.

I. Formation of Compressed Geographic Database

Processes for forming a geographic database including layered parcelized data are disclosed in U.S. Pat. Nos. 5,974,419, 5,953,722, and 5,968,109, the entire disclosures of which are incorporated by reference herein. One exemplary process is disclosed with reference to FIGS. 11A–11C. Starting with a geographic database 900 that is provided in a generalized data format, separate intermediate format files 902 for each data type and layer are formed (at Step A). The generalized data format geographic database 900 may be in a proprietary format or in a non-proprietary format. In the generalized data format geographic database file 900, the geographic data may be undifferentiated as to type and layer. These intermediate format files 902 formed from the generalized data format database file 900 are created in order to derive each of the different types of data, such as routing 136, cartographic 137, point-of-interest 139, maneuver 138, and so on, as shown in FIG. 4, as well as to derive each of the layers of some of these types, as shown in FIG. 5.

As these intermediate format files 902 are formed, temporary reference numbers are assigned (at Step B). In the final format file, there are various instances in which data of one type references data of another type or data in one layer references data in another layer. Likewise, there are various indices, such as indices 147 and 149 in FIGS. 4 and 5, which relate data records of different types to each other. These data references will be resolved at a later stage to take into account the parcelization of the database. However, at this stage, in order to build the various references in the different types, layers, and indices of data, temporary reference numbers are used.

Figure 11B:
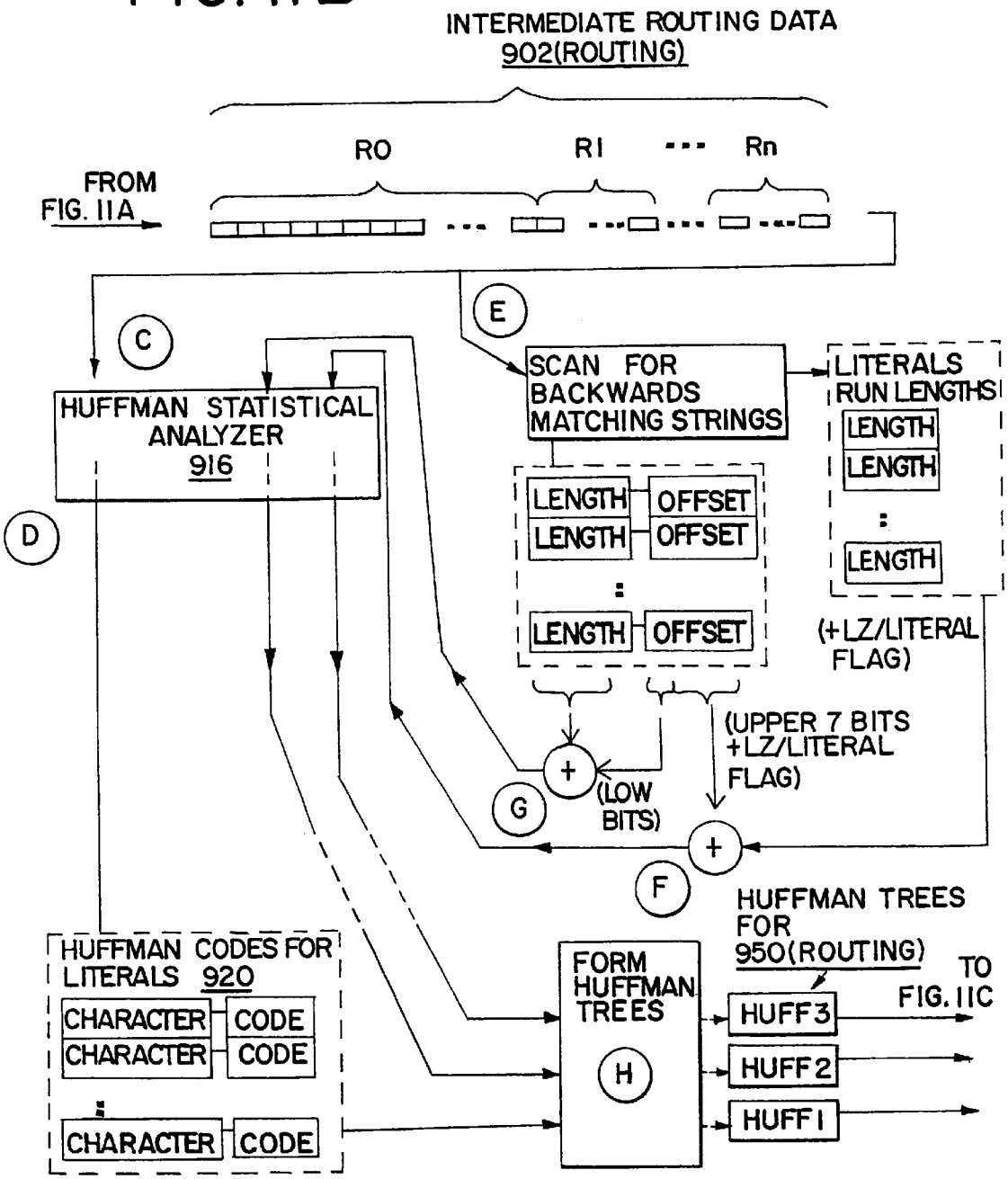

Following the formation of each type of data (e.g., routing, cartographic, etc.), each separate type is directed to a compression stage. The compression stage is shown in FIG. 11B. For purposes of this disclosure, only the compression of the routing data is described. It is understood that the other kinds of data can be compressed in a similar manner.

All the intermediate routing data 902 (routing) are input to a Huffman encoding statistical data collection routine 916 (at Step C). A first collection 920 of Huffman codes is developed (at Step D). This first collection 920 relates each literal character in the routing data to a Huffman code based upon the relative frequency of occurrence of each literal character. The shortest codes are assigned to the most frequently occurring characters.

All the intermediate routing data 902 (routing) are input to a compression routine that scans the route calculation data to identify backward references to matching data strings (at Step E). Those offsets greater than a predetermined value (e.g., x bytes) are ignored. Run lengths of non-substituted (i.e., "literals") are determined. The 8-bit combinations of literal/LZ flag and uppermost 7 bits of the offsets and literal run lengths are combined and fed into the Huffman encoding statistical data collection routine 916 using a work area for flag/offset and literal run length values (at Step F). Likewise, the remaining low bits of the offsets and the match length are combined and input into the Huffman encoding statistical data collection routine 916 using a work area for low bit offset/match values (at Step G).

Following these statistical analyses of the routing data 902 (routing), three Huffman tress are formed (at Step H). A first Huffman tree "huff1" encodes the literal byte values. A second Huffman tree "huff2" encodes the match lengths and offset low bits. A third Huffman tree "huff3" encodes the LZ/literal flag and offset high bits or literal run lengths.

Referring to FIG. 11C, the approximate compressed parcel sizes are estimated by an estimator routine 960 (at Step I). Then, given the estimated final sizes of the parcels, the parcel ID's are assigned. Once the parcel ID's are assigned, the temporary reference ID's that were assigned throughout the intermediate routing data 902 in Step B can be replaced with the new parcel ID's (at Step J).

At this stage, the intermediate data 902 can be compressed. Each type of data (e.g., routing, cartographic, maneuver, and so on) are compressed (at Step K). When compressing, the Huffman trees 950 that were developed in Step H are used. In the step of compression, two processes are performed. First, substrings that match previous substrings are replaced by substitution codes, and then, the literals, offsets, and literal/substitution lengths are replaced with their corresponding Huffman codes. The Huffman trees that were used to replace the literals, offsets, and string lengths are stored in a global data portion of the geographic database and properly identified (at Step L).

As the data are compressed, they are formed into parcels (at Step M). The parcels can be formed using the methods disclosed above. Different kinds of parcelization processes can be used. As the data are formed into parcels, the resultant size of the data that forms each parcel is checked. After the data which have been designated for a parcel have been compressed, the amount of storage required for the data should not exceed the maximum parcel size. For example, if the parcels are formed so that the size of each parcel does not exceed 16 K, then after the geographic data are compressed, the resultant size of the data designated as corresponding to the parcel is checked to confirm that the size, after compression, does not exceed the 16 K limit. To the extent that the resultant compressed data size falls short of the maximum parcel size limit, padding is added to the compressed data so that each parcel includes either all compressed data or compressed data and padding that equal the maximum parcel size.

As the parcels for each of the separate types and layers are formed, the parcels for each layer and type are concatenated into a single file 912 (at Step N). In forming the single file 912, the Huffman trees 950 may be stored in a global portion of the database file (as shown in FIG. 6).

J. The De-Compression Stage

As mentioned above, a decompression routine is used to decompress the geographic data that have been stored on a medium in a compressed format. In one embodiment, the decompression routine is included as part of the navigation application program 18. According to one embodiment, the decompression routine is part of a library of data access functions that provide an interface to the navigation functions.

In a present embodiment, the decompression routine is configurable. One way that the decompression routine is configurable is that it is used only if needed. As mentioned above, in some navigation systems, the media upon which a geographic database is stored may be removable. This enables an older geographic database to be replaced with a newer, updated version, or this enables an end-user to change media if a different coverage area is desired. It is possible that data compression of the geographic data on the medium may not always be necessary. Therefore, some copies or versions of a geographic database for some coverage areas may not require that the geographic data be compressed on the media. To support this configurability, the navigation application includes an initialization routine. The initialization routine checks—among other things—whether the geographic database stored on the media installed in the navigation system is compressed. Setup parameters, such as data flags or other indication means, may be included in an initial portion or global portion of the media. This portion of the media is not compressed so that it can be read before the decompression routine is loaded. These setup parameters on the initial portion of the medium indicate whether the geographic data on the media are compressed. These parameters may also indicate what kinds of compression are used and whether all the different types of data on the medium are compressed with the same kinds of compression. The setup parameters may also indicate whether different kinds of compression were used with respect to the different kinds of data. This initialization routine performs this checking process when the navigation system is powered up. If the geographic data are not compressed, the initialization routine may omit loading the decompression routine and the geographic data are read from the medium without the need for decompression.

On the other hand, if the setup parameters indicate that the geographic data on the media are compressed, the decompression routine is loaded. The decompression routine may be maintained in memory throughout operation of the navigation application in order to perform decompression of the data as needed. If not all the geographic data on the media have been compressed, the decompression routine is used only when needed.

As mentioned above, the compression of data on the media is preferably implemented consistently with the arrangement of data to enhance operation of the navigation system. Likewise, the decompression routine operates in conjunction with these navigation enhancing features and with the procedures, functions, and/or routines that implement them. For example, when one of the navigation application functions requests geographic data, functions among the data access library identify which parcel(s) on the media contain the desired data. Indices on the media may be used for this purpose. Then, other functions may identify the appropriate location(s) to be read from the media.

Up until this point, the operation of the navigation application program functions and the data access functions have operated the same as if the data on the media were not compressed. At the time that the data are actually read from the media, the decompression function operates.

After the parcel with the compressed data has been read from the media, it is stored in an appropriate location in the memory (e.g., RAM 20 in FIG. 1) of the navigation system. For example, the parcel may be located in a cache of several parcels which have been read from the media and which all contain data to be returned to the navigation application.

To decode a parcel, a bit pointer is pointed to the top of the parcel. The initial code in the parcel will be a Huffman code. In a present embodiment, a parcel will not start with a substitution code, and therefore the initial Huffman code, when decoded, will include a run length count that indicates how many of the Huffman codes following this initial code are Huffman codes for literals which are to be decoded using the first Huffman tree. Because the run length counts for literals are encoded, along with the LZ/literal bit flag, in the third Huffman tree, the initial Huffman code is decoded using the third Huffman tree. Note that this initial Huffman code in a parcel, when decoded using the third Huffman tree, will include a LZ/literal flag (set to indicate that the data following this bit is a run length count for literals) followed by the run length count. Although it can be assumed that a parcel does not start with a substitution code and therefore the LZ/literal flag in the initial code is redundant and unnecessary, using the same Huffman tree for this initial run length count provides overall efficiency.

The reason that a parcel starts with literals and not a substitution code is that, in general, there is no way to know what data has been read prior to the start of a parcel. As mentioned above, a parcel represents a collection of data that is always accessed together from the medium. However, there is, in general, no predetermined order for accessing parcels, i.e., one parcel is not necessarily always read after another parcel. Therefore, a parcel of data would not start with a substitution code including a backwards offset to a previous matching substring because there is no way to be sure what previous data has already been read. (Because a parcel starts with literals, using the first bit to indicate "literals" may be redundant. Therefore, it is possible to omit this first bit in an alternative embodiment.)

Following the decoding of the initial Huffman code using the third Huffman tree, the number of subsequent Huffman codes, indicated by the initial run length count, are decoded using the first Huffman tree. These codes are decoded using the first Huffman tree, which associates Huffman codes with the literal characters.

Following the decoding of these Huffman codes for literals, the next Huffman code is decoded. Because it is necessary to know whether the subsequent data are literal data or a substitution code, this code will include a LZ/literal flag. This Huffman code will be decoded using the third Huffman tree because this tree includes the LZ/literal flag and either the run length count or the high bits of the offset of the substitution code. When decoded using the third Huffman tree, the first bit in the decoded byte indicates whether the immediately following data refers to the run length of literals or a substitution code. Assuming that this bit is set to indicate that the following data are a substitution code, the remainder of this decoded byte will be the high bits of the offset and the immediately next Huffman code, when decoded, will include the rest of the substitution code including the low bits of the offset and the match length. This immediately next Huffman code is decoded using the second Huffman tree. Once both parts of the substitution code are obtained from these two Huffman codes, a copy of the substring of previously decoded literals, starting from the position of the offset and having a length equal to that of the match length, is inserted at this point to restore the original uncompressed data stream.

This process is continued until the entire parcel is decompressed.

Once the data in the parcel is decompressed, they are handled just as if the data on the medium were not compressed. That is, the data in the parcel which is required to be returned to the navigation application are identified and returned. The operation of the decompression routine is therefore transparent to the navigation application functions and the functions that access and locate the data.

IV. Alternative Embodiments

In the above embodiments, the geographic database was described as parcelized. In alternative embodiments, the geographic database may be organized other than in parcels.

In some of the above embodiments, the geographic database is described as being stored on a medium in compressed form. In alternative embodiments, the disclosed compression techniques can be applied to a geographic database, or portions thereof, that are being transmitted, for example, via wireless transmission from a central server to a vehicle.

In the embodiments disclosed above, data compression is described as being applied to a geographic database that is formed to have various features and/or arrangements that enhance use of the data for navigation purposes. It is intended that the data compression embodiments disclosed herein are not restricted to use with a geographic database having any particular kinds of navigation enhancing features. For example, the data compression techniques disclosed herein may be applied to a geographic database that is not organized into separate types, or that is not organized into layers, or that is not parcelized.

In the embodiments described above, three kinds of Huffman trees are used for each type of data in the geographic database. In alternative embodiments, fewer or more than three Huffman trees can be used.

The general steps set forth above for forming a geographic database represent only examples of ways that a geographic database can be formed. It is understood that there are other methods for forming a geographic database and that the compression techniques disclosed herein can be used in conjunction with the geographic databases formed according to other processes.

In the embodiments disclosed above, compression of geographic data in a geographic database used by a navigation application in a navigation system was described. In alternative embodiments, the navigation system should be understood to include any computer-based system that provides navigation functions to an end-user regardless of hardware platform or architecture. For example, the navigation system may include any kind of portable system, such as hand-held systems or systems installed on personal digital assistants or personal computers. In alternative embodiments, the navigation system may include navigation application software installed on a personal computer, such as a desktop computer. Further, the navigation system may be implemented in various different environments, including networked environments and client-server platform environments. The navigation application program and the geographic database need not be located in the same location, but may connected over a network. The geographic database may be located remotely from the end-user and the data transmitted to the end-user over a wireless network. In addition, all or a portion of the software may be remotely located.

Other terminology may be used to refer to the physical features or to the data that represent the physical features. It is understood that the subject matter disclosed herein is not limited to any particular terminology that expresses similar concepts.

In some of the embodiments described above, the compression system and method were indicated to have particular value for geographic data stored in a manner that enhances operation of a navigation application program that uses the data. The compression technique can also be used with other kinds of data, and in particular kinds of data that have been arranged in a manner that facilitate use of the data by specific applications. Examples of kinds of data arrangements include digital encyclopedias, digital catalogues, digital archives, etc.

It is intended that the foregoing detailed description be regarded as illustrative rather than limiting and that it is understood that the following claims including all equivalents are intended to define the scope of the invention.

We claim:

1. A compression format for storing a collection of data on a medium, wherein said data are required to be decompressed to an uncompressed form in order to use the data for performing functions, the compression format comprising:

an arrangement of said collection of data wherein said collection is separated into a plurality parcels each of which includes a plurality of data items which form at least part of said collection, wherein said plurality of data items in each parcel are accessed together as a group in a given sequence; and a plurality of substitution codes included among said arrangement of a plurality of data items, each of said plurality of substitution codes including an offset from a position in said arrangement of a plurality of data items at which said substitution code is located into a position sequentially backwards therefrom.

2. The compression format of claim 1 wherein each of said plurality of substitution codes also include a substring length.

3. The compression format of claim 1 wherein the offset of each of said plurality of substitution codes is constrained to reference a position sequentially backwards within the same parcel as the substitution code including said offset.

4. A method for decompressing a compressed data stream comprising:

starting at a first end of the compressed data stream, advancing through a portion of the data stream until encountering a substitution code that indicates a substitution substring length and an offset backwards into said data stream toward said first end; and forming an uncompressed output from said compressed data stream, wherein said uncompressed output comprises the portion of the data stream up to said substitution code and a substitution substring appended thereto, wherein said substitution substring corresponds to that part of said portion of said substitution substring length located at said offset from substitution code within said portion.

5. The method of claim 4 further comprising:

after encountering said substitution code, continuing to advance through the data stream to a second end thereof, wherein said second end is opposite from said first end; and during said step of continuing to advance, as each substitution code is encountered, wherein each substitution code indicates a substitution substring length and an offset backwards into said data stream toward said first end, continuing to form the uncompressed output from said compressed data stream, wherein said uncompressed output comprises the portion of the data stream up to each substitution code and a substitution substring appended thereto, wherein each said substitution substring corresponds to that part of said portion of said substitution substring length located at said offset from said substitution code within said portion.

6. A method for using data from a geographic database with a navigation application, wherein the data represent individual segments of roads, and wherein the geographic database includes portions that are in a compressed format, the method comprising:

with a software application that provides a navigation-related feature for automobile travel on said roads, identifying a portion of the geographic database that contains data needed for the navigation application;

accessing the portion of the geographic database that had been identified;

decompressing the portion that had been accessed thereby forming an uncompressed version of the portion that had been accessed; and using the decompressed version of the portion of the geographic database in the navigation application.

7. The method of claim 6 wherein the step of decompressing further comprises:

advancing through the portion of the database that had been accessed until encountering a substitution code that indicates a substring length and a backwards offset into the portion of the database that had been accessed; and in the portion of the database being accessed, replacing the substitution code with a substring having the substring length and located at the backwards offset thereby forming the decompressed version of the portion of the geographic database that had been accessed.

8. The method of claim 6 wherein the step of decompressing further comprises:

replacing Huffman codes in the portion of the geographic database that had been accessed with corresponding decoded representations of the Huffman codes thereby forming the decompressed version of the portion of the geographic database that had been assessed.

9. The method of claim 6 wherein the step of accessing obtains the portion of the geographic database from a physical medium upon which the geographic database is stored.

10. The method of claim 6 wherein the step of accessing obtains the portion of the geographic database via a wireless communications link.

11. The method of claim 6 further comprising:

prior to the step of identifying, using an initialization routine to determine that the geographic database used by the navigation system contains compressed data.

12. The method of claim 6 wherein the step of identifying is performed using an index.

13. The method of claim 6 further comprising:

after the step of accessing, storing the portion of the geographic database in a cache along with other portions of the geographic database that have been accessed.

14. The method of claim 6 wherein the step of decompressing further comprises:

(a) starting at a top of the portion, decoding an initial code, wherein the initial code is a Huffman code that, when decoded, indicates an initial run length count for literals;

(b) decoding a subsequent number of Huffman codes as literals, wherein the subsequent number corresponds to the initial run length count indicated by the decoded initial code;

after decoding the subsequent number of Huffman codes, (c) decoding a next Huffman code, wherein the next Huffman code indicates whether subsequent codes are literals or a substitution code;

(d) if the next Huffman code indicates that subsequent Huffman codes are literals, decoding a subsequent number of Huffman codes as literals, but (e) if the next Huffman code indicates that a subsequent Huffman code is a substitution code, decoding the subsequent Huffman code as a substitution code, wherein the decoded substitution code indicates a substitution string length and an offset, and then replacing the substitution code with a string which is identical to the string having a length corresponding to the substitution string length and which is located at the offset into that part of the portion that has already been decoded; and then (f) performing steps (c)–(e) until a bottom of the portion is reached.

15. The method of claim 6 wherein the step of decompressing further comprises:

using a Huffman tree located in another portion of the geographic database to decode Huffman codes included in the portion of the geographic database being decompressed.

16. The method of claim 6 wherein the portion of the geographic database contains data that represent geographic features located in a separate one of a plurality of rectangular areas into which a region represented by the geographic database is divided.

* * * * *